(12) United States Patent
Kawashima et al.

(10) Patent No.: US 7,288,311 B2
(45) Date of Patent: Oct. 30, 2007

(54) BARRIER FILM

(75) Inventors: Sayaka Kawashima, Tokyo (JP); Minoru Komada, Tokyo (JP); Shinya Satou, Tokyo (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 248 days.

(21) Appl. No.: 10/774,709

(22) Filed: Feb. 9, 2004

(65) Prior Publication Data

US 2004/0253451 A1    Dec. 16, 2004

(30) Foreign Application Priority Data

Feb. 10, 2003   (JP)   ............... 2003-031862
Mar. 31, 2003   (JP)   ............... 2003-096573

(51) Int. Cl.
*B32B 7/02*   (2006.01)
*B32B 9/04*   (2006.01)
*B32B 19/00*  (2006.01)

(52) U.S. Cl. ............ 428/212; 428/213; 428/218; 428/411.1; 428/698; 428/701; 428/702

(58) Field of Classification Search ............ 428/411.1, 428/425.5, 428, 429, 212, 213, 688, 698, 428/701, 702, 208

See application file for complete search history.

(56) References Cited

U.S. PATENT DOCUMENTS 5,888,593 A * 3/1999 Petrmichl et al. ........... 427/563

FOREIGN PATENT DOCUMENTS

JP        08-164595        6/1996

* cited by examiner

*Primary Examiner*—Rena Dye
*Assistant Examiner*—Lawrence D. Ferguson
(74) *Attorney, Agent, or Firm*—Seyfarth Shaw LLP

(57) ABSTRACT

A barrier film is provided having extremely high barrier properties and a good transparency as part of a laminated material having use as a packaging container which may possess an image display medium, the high barrier properties and good transparency which are achieved with a barrier film comprised of a base material film and a barrier layer deposited on at least one side surface of the base material film, with the barrier layer comprising a water repellent layer and a dense layer, the water repellent layer being a silicon oxide carbide film having the atomic percent of Si:O:C in a range of 100:40 to 120:80 to 160, and the thickness in a range of 2 to 300 nm, and the dense layer being a silicon oxide carbide film having the atomic percent of Si:O:C in a range of 100:100 to 200:5 to 100, and the thickness in a range of 5 to 300 nm.

20 Claims, 9 Drawing Sheets

BARRIER FILM

BACKGROUND OF THE INVENTION

1. Field of the Invention

The present invention relates to a barrier film having an extremely high barrier property used as a packaging material for the foods, the medicines and the like, a packaging material and a substrate material for electric devices and the like, a production method therefor, and a laminated material, a packaging container, and an image display medium using the barrier film.

2. Description of the Related Art

Conventionally, as a packaging material having a gas barrier property with respect to the oxygen gas, the water vapor, or the like, and a good storage suitability for the foods, the medicines, or the like, those of various kinds have been developed and proposed. For example, a barrier film comprising a coating layer of a polyvinylidene chloride (PVDC) or an ethylene vinyl alcohol copolymer (EVOH) deposited on a plastic base material has been proposed.

However, according to the gas barrier film, the barrier property with respect to the oxygen and the water vapor is not sufficient. In particular, a problem is involved in that the remarkable deterioration of the barrier property is generated by the high temperature sterilizing process. Furthermore, according to a gas barrier film provided with a coating film of a polyvinylidene chloride (PVDC), the poisonous dioxin is generated at the time of the burning so that the adverse effect to the environment is concerned.

Then, recently, a barrier film comprising a vacuum deposition film of an inorganic substance such as a silicon oxide and an aluminum oxide deposited on a base material film has been proposed. Moreover, a lamination of a resin layer made of an epoxy resin or a mixture thereof, and the above-mentioned vacuum deposition film has been proposed (Japanese Patent Application Laid-Open (JP-A) No. 8-164595).

In contrast, according to electronic devices, for example an image display apparatus such as a flexible display, in the case a barrier film is used as the base material for a plastic film base as a glass base material substitute, or in the case a barrier film is used as a cover film for a solar battery module, a barrier property higher than the barrier property required to the conventional packaging application (for example, a 1.0 cc/m²/day·atm or less oxygen transmission rate, and a 1.0 g/m²/day or less water vapor transmission rate) is required to the barrier film. Moreover, the heat stability and the chemical resistance durable to the high temperature and the various processing chemicals at the time of producing a display element are required to the barrier film. Furthermore, even after providing the product, maintenance of the high barrier property under a severe environment such as a high humidity and heat stability test is required.

Since the conventional gas barrier film provided with a vacuum deposition film of an inorganic oxide such as a silicon oxide and an aluminum oxide has the excellent transparency and it hardly influences the environment, the demand thereof to a packaging material, or the like can be highly expected. However, the barrier properties of the barrier film are still lower than that of the packaging laminated material using an aluminum foil. Moreover, in the case the vacuum deposition film of the inorganic oxide is of a single layer, a problem is involved in that the barrier properties are deteriorated at the time there is omission of the deposition.

SUMMARY OF THE INVENTION

The present invention has been achieved in view of the above-mentioned problems, and a main object thereof is to provide a barrier film having extremely high barrier properties and a good transparency, a laminated material using the above-mentioned barrier film, a packaging container, and an image display medium.

In order to achieve the above-mentioned object, the present invention provides a barrier film comprising a base material film and a barrier layer deposited on at least one side surface of the base material film, wherein the barrier layer comprises a water repellent layer and a dense layer, the water repellent layer is a silicon oxide carbide film having the atomic percent of Si:O:C in a range of 100:40 to 120:80 to 160, and the thickness in a range of 2 to 300 nm, and the dense layer is a silicon oxide carbide film having the atomic percent of Si:O:C in a range of 100:100 to 200:5 to 100, and the thickness in a range of 5 to 300 nm.

According to the present invention, since the water repellent layer comprising the barrier layer provides the high water vapor barrier property and the dense layer provides the high gas barrier property, the advantage of obtaining the extremely high barrier properties as the entire barrier layer can be provided.

Moreover, according to the present invention, the above-mentioned barrier layer may have a laminated structure comprising the water repellent layer, the dense layer formed on the water repellent layer, and the water repellent layer formed on the dense layer. Moreover, the above-mentioned barrier layer may have a laminated structure comprising the dense layer, the water repellent layer formed on the dense layer, and the dense layer formed on the water repellent layer. Furthermore, the above-mentioned barrier layer may have a laminated structure comprising the water repellent layer, and the dense layer formed on the water repellent layer. Since the above-mentioned barrier layer has a laminated structure with the water repellent layer and the dense layer laminated alternately, the barrier property can be improved.

Furthermore, according to the present invention, the above-mentioned barrier layer may be a silicon oxide carbide film comprising the water repellent layer, the dense layer formed on the water repellent layer, and the water repellent layer formed on the dense layer, with the atomic percent of O (oxygen) with respect to Si (silicon) reduced continuously from the central part in the thickness direction toward the both outer sides and the atomic percent of C (carbon) with respect to Si (silicon) increased from the central part the both outer sides in the thickness direction. Moreover, the above-mentioned barrier layer may be a silicon oxide carbide film comprising the dense layer, the water repellent layer formed on the dense layer, and the dense layer formed on the water repellent layer, with the atomic percent of O (oxygen) with respect to Si (silicon) increased continuously from the central part toward the both outer sides in the thickness direction and the atomic percent of C (carbon) with respect to Si (silicon) reduced from the central part toward the both outer sides.

Moreover, according to the present invention, the above-mentioned barrier layer may be a silicon oxide carbide film comprising the water repellent layer, and the dense layer formed on the water repellent layer, with the atomic percent of O (oxygen) with respect to Si (silicon) increased continuously from the base material film side toward the outer side and the atomic percent of C (carbon) with respect to Si (silicon) reduced from the base material film side toward the outer side, Moreover, the above-mentioned barrier layer may be a silicon oxide carbide film comprising the dense layer, and the water repellent layer formed on the dense layer, with the atomic percent of O (oxygen) with respect to Si (silicon) reduced continuously from the base material film side toward the outer side, and the atomic percent of C (carbon) with respect to Si (silicon) increased from the base material film side toward the outer side.

Furthermore, according to the present invention, it is preferable that the above-mentioned barrier layer is laminated by two or more layers. By laminating the barrier layer by two or more layers, even in the case there are defects in the barrier layer of the first layer, the defects can be compensated by the barrier layer of the second layer so that the barrier property can be improved.

Moreover, according to the present invention, it is preferable that a plasma treatment process is applied to the uppermost surface of the above-mentioned barrier layer. By applying the plasma treatment process, the close contact property with respect to, for example, a resin layer, a heat sealable resin layer, or the like can be improved.

Furthermore, according to the present invention, the above-mentioned barrier layer may be deposited on the base material film via a resin layer, or a resin layer maybe deposited on the barrier layer. By providing the resin layer, the barrier property can further be improved.

Moreover, according to the present invention, it is preferable that the oxygen transmission rate (OTR) is 3 cc/m$^2$/day·atm or less, and the water vapor transmission rate (WVTR) is 3 g/m$^2$/day or less. By having the barrier property of this degree, it can be used for the various applications.

Moreover, the present invention provides a laminated material comprising a heat sealable resin layer deposited on at least one side surface of the above-mentioned barrier film, and a packaging container using the laminated material, produced by thermally fusing the heat sealable resin layer into a bag or a box.

Furthermore, the present invention provides an image display medium using the above-mentioned barrier film.

DESCRIPTION OF THE PREFERRED EMBODIMENT

Hereinafter, a barrier film of the present invention, a laminated material using the same, a pack packaging container and an image display medium will be explained.

A. Barrier Film

First, a barrier film of the present invention will be explained.

A barrier film according to the present invention comprises a base material film and a barrier layer deposited on at least one side surface of the base material film, wherein the barrier layer comprises a water repellent layer and a dense layer, the water repellent layer is a silicon oxide carbide film having a predetermined atomic percent of Si:O:C, and a predetermined thickness, and the dense layer is a silicon oxide carbide film having a predetermined atomic percent of Si:O:C, and a predetermined thickness.

Figure 1:
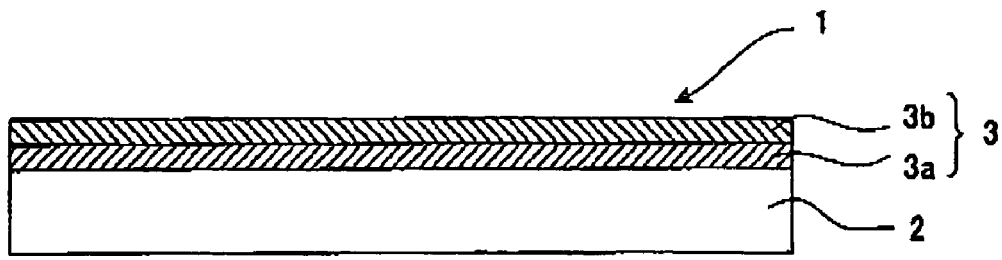
FIG. 1 is a schematic cross sectional view showing an example of a barrier film of the present invention.

The barrier film according to the present invention will be explained with reference to the drawings. FIG. 1 shows an example of a barrier film of the present invention. In FIG. 1, a barrier film 1 comprises a base material film 2, and a barrier layer 3 formed on one side surface of the base material film 2. The above-mentioned barrier layer 3 comprises a dense layer 3a and a water repellent layer 3b.

According to the present invention, since the dense layer is a dense layer including a small amount of carbon atoms, it provides a high barrier property with respect to a gas such as an oxygen. In contrast, since the water repellent layer is a layer having a water repellent property with a large amount of carbon atoms present, it provides a high barrier property with respect to the water content. Therefore, an extremely high barrier property can be obtained as the entire barrier layer.

Hereinafter, each configuration of the barrier film will be explained.

1. Barrier Layer

The barrier layer used in the present invention comprises a water repellent layer and a dense layer. Moreover, the above-mentioned water repellent layer is a silicon oxide carbide film having a predetermined atomic percent of Si:O:C, and a predetermined thickness, and the above-mentioned dense layer is a silicon oxide carbide film having a predetermined atomic percent of Si:O:C, and a predetermined thickness.

Hereinafter, each configuration of the barrier layer will be explained.

(1) Water Repellent Layer

The water repellent layer used in the present invention is a silicon oxide carbide film having a predetermined atomic percent of Si:O:C, and a predetermined thickness. Since the water repellent layer used in the present invention has a high water repellent property so that the number of the water vapor adsorption points is extremely small, a high water vapor barrier property can be provided.

The atomic percent of Si:O:C of the above-mentioned water repellent layer is in general in a range of 100:40 to 120:80 to 160, it is more preferably in a range of 100:60 to 120:90 to 160, and particularly preferably in a range of 100:80 to 120:100 to 160. By having the above-mentioned atomic percent in the range, a layer with an extremely small number of the water vapor adsorption points can be obtained so that a high water vapor barrier property can be provided. Moreover, in the case the atomic percent in the above-mentioned water repellent layer is outside the range, the water repellent property is insufficient so that the effect of improving the barrier property by providing the water repellent layer may not be obtained.

In the present invention, for the above-mentioned atomic percent, the values measured by the photoelectron spectroscopy (ESCA) are used.

Moreover, the thickness of the above-mentioned water repellent layer is in general in a range of 2 nm to 300 nm, it is more preferably in a range of 5 nm to 100 nm, and it is particularly preferably in a range of 5 nm to 50 nm. In the case the thickness of the water repellent layer is too thin, the water vapor barrier property is lowered so that the effect of improving the barrier property by providing the water repellent layer may not be obtained. In contrast, in the case the thickness of the water repellent layer is too thick, the barrier property and the transparency are lowered and the time needed for the film formation may be prolonged.

Furthermore, as to the water repellent property of the above-mentioned water repellent layer, the contact angle with respect to water is in a range of 60° to 140°, it is more preferably in a range of 80° to 140°, and it is particularly preferably in a range of 90° to 140°. The above-mentioned contact angle with respect to water is a value obtained with a contact angle measuring device (type CA-Z) produced by Kyowa Interface Science Co., Ltd. That is, a method of physically finding the contact angle by dropping a drop (constant amount) of pure water onto the surface of a subject to be measured and observing the water droplet shape with a microscope or a CCD camera after passage of a certain time is used, and the contact angle with respect to water measured by this method is defined to be the contact angle with respect to water in the present invention.

(2) Dense Layer

Next, the dense layer used in the present invention will be explained. The dense layer used in the present invention is a silicon oxide carbide film having a predetermined atomic percent of Si:O:C, and a predetermined thickness, Since the dense layer used in the present invention has a high density and it is dense, a high gas barrier property can be provided.

The atomic percent of Si:O:C of the above-mentioned dense layer is in general in a range of 100:100 to 200:5 to 100, it is more preferably in a range of 100:120 to 200:10 to 80, and particularly preferably in a range of 100:140 to 200:10 to 60. By having the above-mentioned atomic percent in the range, a dense layer with a high density can be provided so that the barrier property with respect to a gas such as oxygen can be improved. Moreover, in the case the atomic percent in the above-mentioned dense layer is outside the range, the density is insufficient so that the sufficient density cannot be obtained and the barrier property may be lowered.

Moreover, the thickness of the above-mentioned dense layer is in general in a range of 5 nm to 300 nm, it is more preferably in a range of 5 nm to 100 nm, and it is particularly preferably in a range of 10 nm to 50 nm. In the case the thickness of the dense layer is too thin, the gas barrier property may be lowered. In contrast, in the case the thickness of the dense layer is too thick, the barrier property and the transparency are lowered and the time needed for the film formation may be prolonged.

Furthermore, the density of the above-mentioned dense layer is in general in a range of 2.0 to 3.0 g/cm$^3$, it is more preferably in a range of 2.5 to 3.0 g/cm$^3$, and it is particularly preferably in a range of 2.7 to 3.0 g/cm$^3$. The above-mentioned density is a value measured by an X ray reflectance measuring device.

(3) Barrier Layer

Figure 2:
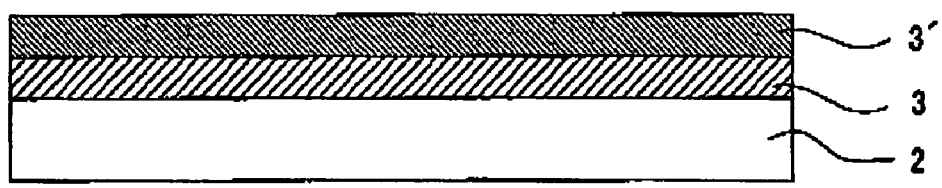
FIG. 2 is a schematic cross sectional view showing another example of a barrier film of the present invention.

The barrier layer used in the present invention may be for example a single layer as shown in FIG. 1, or it may comprise a first barrier layer 3 and a second barrier layer 3' laminated as shown in FIG. 2. In the present invention, it is preferable that the barrier layer is laminated by two or more layers, it is more preferably laminated by two to ten layers, and it is particularly preferably laminated by two layers. Even in the case there are defects such as omission of the deposition, or the like in the first barrier layer, since the second barrier layer can compensate the defects by laminating the barrier layer in a plurality, the barrier property can further be improved.

The above-mentioned barrier layer has an extremely high barrier property. As the specific barrier property, the oxygen transmission rate is 0.5 cc/m$^2$/day·atm or less, and the water vapor transmission rate is about 0.5 g/m$^2$/day or less. Furthermore, the barrier layer also has the excellent durability.

The film thickness of such a barrier layer used in the present invention can be set optionally in a range of 5 nm to 500 nm, preferably in a range of 10 nm to 200 nm. In the case the thickness of the barrier layer is thinner than the above-mentioned range, the extremely high barrier property (it denotes about the oxygen transmission rate of 0.5 cc/m$^2$/day·atm or less, and the water vapor transmission rate of 0.5 g/m$^2$/day or less) may not be provided. Moreover, in the case the thickness of the barrier layer is thicker than the above-mentioned range, the stress is applied largely so that cracking can be generated easily in the barrier layer in the case the base material film is a flexible film so that the barrier property is lowered and a trouble of prolonging the time needed for the film formation may be generated.

Moreover, according to the present invention, the barrier layer may be formed on one side surface of the base material film, or it may be formed on the both sides of the base material film.

Furthermore, according to the present invention, it is preferable that a plasma treatment process is applied to the uppermost surface of the barrier layer. Since the wettability of the uppermost surface of the barrier layer can be improved or the uppermost surface of the barrier layer can be roughed by applying the plasma treatment process, the close contact property with respect to the resin layer, the anchor coating agent layer, the adhesive layer, the heat sealable resin layer or another film to be described later can be improved. Moreover, it is also advantageous in that these layers can be formed by coating. As the plasma treatment process, for example, a process using a reactive gas such as an oxygen plasma and a nitrogen plasma, a process using an inert gas such as an argon plasma and a helium plasma, or the like can be presented. In particular, in the case of obtaining the chemical process effect, it is preferable to execute a process using a reactive gas such as an oxygen plasma and a nitrogen plasma, and in contrast, in the case of obtaining the physical process effect, it is preferable to execute a process using an inert gas such as an argon plasma and a helium plasma. Moreover, in the case of obtaining the effect of both the chemical process effect and the physical process effect, a plasma mixture as a combination of two or more kinds of the above-mentioned plasma treatment processes may be used. Here, the uppermost surface of the barrier layer denotes the surface opposite to the surface with the base material film formed.

In the present invention, the barrier layer is not particularly limited as long as it has the above-mentioned water repellent layer and the above-mentioned dense layer. It may be one comprising a water repellent layer and a dense layer, one comprising a plurality of the water repellent layer and a dense layer, one comprising a water repellent layer and a plurality of the dense layer, or one comprising a plurality of the water repellent layer and a plurality of the dense layer.

Moreover, the position of forming the water repellent layer and the dense layer in the above-mentioned barrier layer is not particularly limited. For example, the dense layer may be formed on the water repellent layer, the water repellent layer may be formed further on the water repellent layer, and the dense layer may be formed further on the dense layer. Furthermore, in the case, for example, the dense layer is formed on the water repellent layer, the water repellent layer and the dense layer may be contacted directly, or the water repellent layer and the dense layer may not be contacted directly.

Accordingly, the barrier layer used in the present invention is not particularly limited as long as it has the above-mentioned water repellent layer and the above-mentioned dense layer. In particular, it is preferably a silicon oxide carbide film with the water repellent layer and the dense layer contacted directly, or a silicon oxide carbide film with the barrier layer having the atomic percent Si:O:C changed continuously.

In the case the above-mentioned water repellent layer and the dense layer are contacted directly, although the above-mentioned barrier layer is not particularly limited as long as the water repellent layer and the dense layer are contacted directly, in particular, it is preferably (1) one having the water repellent layer and the dense layer laminated, (2) one having the water repellent layer, the dense layer and the water repellent layer laminated in this order, or (3) one having the dense layer, the water repellent layer and the dense layer laminated in this order.

Moreover, in the case the above-mentioned barrier layer is a silicon oxide carbide film with the atomic percent Si:O:C changed continuously, although the above-mentioned barrier layer is not particularly limited as long as it is a silicon oxide carbide film with the atomic percent Si:O:C changed continuously, in particular, it is preferably (4) a silicon oxide carbide film comprising a water repellent layer and a dense layer, with the atomic percent of O (oxygen) with respect to Si (silicon) reduced continuously from the base material film side toward the outer side, and the atomic percent of C (carbon) with respect to Si (silicon) increased from the base material film side toward the outer side, (5) a silicon oxide carbide film comprising a water repellent layer and a dense layer, with the atomic percent of O (oxygen) with respect to Si (silicon) increased continuously from the base material film side toward the outer side, and the atomic percent of C (carbon) with respect to Si (silicon) reduced from the base material film side toward the outer side, (6) a silicon oxide carbide film comprising a water repellent layer, a dense layer and a water repellent layer in this order, with the atomic percent of O (oxygen) with respect to Si (silicon) reduced continuously from the central part in the thickness direction toward the both outer sides, and the atomic percent of C (carbon) with respect to Si (silicon) increased from the central part in the thickness direction toward the both outer sides, or (7) a silicon oxide carbide film comprising a dense layer, a water repellent layer and a dense layer in this order, with the atomic percent of O (oxygen) with respect to Si (silicon) increased continuously from the central part in the thickness direction toward the both outer sides, and the atomic percent of C (carbon) with respect to Si (silicon) reduced from the central part in the thickness direction toward the both outer sides.

The preferable configurations of the barrier layer used in the present invention can be classified into the above-mentioned seven embodiments. Hereinafter, each embodiment will be explained.

First Embodiment

A first embodiment of the barrier layer used in the present invention has a laminated structure comprising a water repellent layer, a dense layer formed on the water repellent layer, and a water repellent layer formed on the dense layer.

Figure 3:
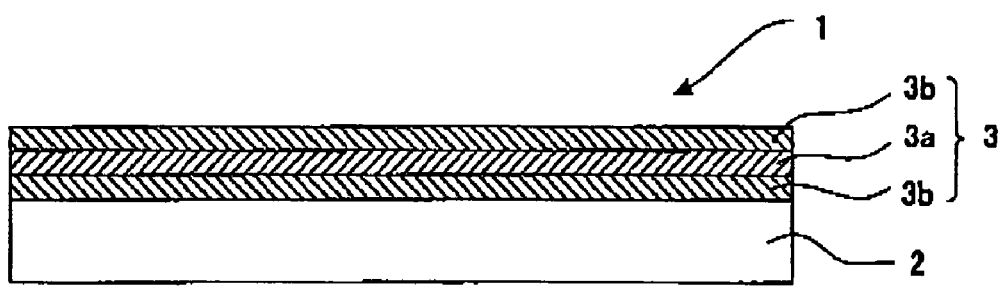
FIG. 3 is a schematic cross sectional view showing another example of a barrier film of the present invention.

The barrier layer of this embodiment will be explained with reference to the drawings. As shown in FIG. 3, a barrier film 1 comprises a base material film 2, and a barrier layer 3 formed on one side surface of the base material film 2. The above-mentioned barrier layer 3 comprises a water repellent layer 3b, a dense layer 3a formed on the water repellent layer 3b, and a water repellent layer 3b formed on the dense layer 3a so as to provide a laminated structure with the above-mentioned three layers laminated.

In this embodiment, since the barrier layer has the water repellent layer deposited on the both side surfaces and the water repellent layers has a high carbon concentration and the water repellent property, the water repellent property can be improved on the surface so that the barrier property with respect to water (water vapor) can be improved on the both side surfaces. In contrast, since the dense layer is provided in the central part of the barrier layer and the dense layer is a dense layer having a low carbon concentration and a high oxygen concentration, the barrier property with respect to a gas such as an oxygen can be improved in the central part.

The atomic percent Si:O:C of the water repellent layer in this embodiment is particularly preferably in a range of 100:40 to 120:80 to 160. Moreover, the atomic percent Si:O:C of the dense layer in this embodiment is particularly preferably in a range of 100.140 to 200:5 to 60.

Second Embodiment

Next, a second embodiment of the barrier layer used in the present invention will be explained. The second embodiment of the barrier layer used in the present invention has a laminated structure comprising a dense layer, a water repellent layer formed on the dense layer, and a dense layer formed on the water repellent layer.

Figure 4:
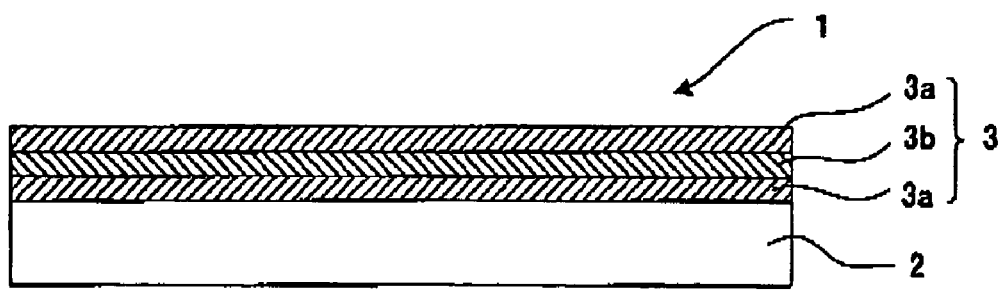
FIG. 4 is a schematic cross sectional view showing another example of a barrier film of the present invention.

The barrier layer of this embodiment will be explained with reference to the drawings. As shown in FIG. 4, a barrier film 1 comprises a base material film 2 and a barrier layer 3 formed on one side surface of the base material film. The above-mentioned barrier layer 3 comprises a dense layer 3a, a water repellent layer 3b formed on the dense layer 3a, and a dense layer 3a formed on the water repellent layer 3b so as to provide a laminated structure with the above-mentioned three layers laminated.

In this embodiment, since the barrier layer has the dense layer deposited on the both side surfaces and the dense layer is a dense layer having a low carbon concentration and a high oxygen concentration, the barrier property with respect to a gas such as an oxygen can be improved on the both side surfaces. In contrast, since the water repellent layer is provided in the central part of the barrier layer and the water repellent layer has a high carbon concentration and the water repellent property, the water repellent property can be improved in the central part so that the barrier property with respect to water (water vapor) can be improved in the central part.

Third Embodiment

Next, a third embodiment of the barrier layer used in the present invention will be explained. The third embodiment of the barrier layer used in the present invention has a laminated structure comprising a water repellent layer and a dense layer formed on the water repellent layer.

The barrier layer of this embodiment will be explained with reference to the drawings. As shown in FIG. 1, a barrier film 1 comprises a base material film 2, and a barrier layer 3 formed on one side surface of the base material film 2. The above-mentioned barrier layer 3 comprises a dense layer 3a and a water repellent layer 3b formed on the dense layer 3a so as to provide a laminated structure with above-mentioned two layers laminated.

In this embodiment, the barrier layer shown in for example FIG. 1 is provided with the dense layer on the base material film side and the dense layer is a dense layer having a low carbon concentration and a high oxygen concentration, the barrier property with respect to a gas such as an oxygen can be improved on the base material film side. In contrast, since the water repellent layer is deposited on the surface of the barrier layer and the water repellent layer has a high carbon concentration and the water repellent property, the water repellent property can be improved on the surface so that the barrier property with respect to water (water vapor) can be improved in the central part.

Figure 5:
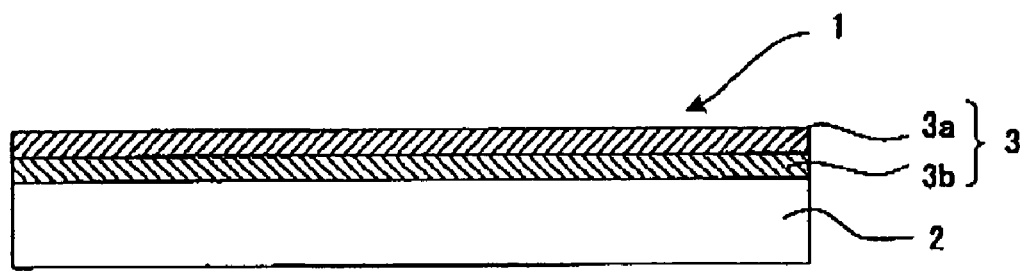
FIG. 5 is a schematic cross sectional view showing another example of a barrier film of the present invention.

Moreover, the barrier layer used in this embodiment is not particularly limited as long as it has a laminated structure with the dense layer and the water repellent layer laminated. For example, it may be one having the dense layer 3a and the water repellent layer 3b laminated in this order from the base material film 2 side as shown in FIG. 1, or it may be one having the water repellent layer 3b and the dense layer 3a laminated in this order from the base material film 2 side as shown in FIG. 5.

The atomic percent Si:O:C of the water repellent layer in this embodiment is particularly preferably in a range of 100:40 to 120:80 to 160. Moreover, the atomic percent Si:O:C of the dense layer in this embodiment is particularly preferably in a range of 100:140 to 200:5 to 60.

Fourth Embodiment

Next, a fourth embodiment of the barrier layer used in the present invention will be explained. The fourth embodiment of the barrier layer used in the present invention is a silicon oxide carbide film comprising a water repellent layer, a dense layer formed on the water repellent layer, and a water repellent layer formed on the dense layer, with the atomic percent of O (oxygen) with respect to Si (silicon) reduced continuously from the central part in the thickness direction toward the both outer sides, and the atomic percent of C (carbon) with respect to Si (silicon) increased from the central part in the thickness direction toward the both outer sides.

The barrier film of this embodiment will be explained with reference to the drawings. As shown in FIG. 3, a barrier film 1 comprises a base material film 2, and a barrier layer 3 formed on one side surface of the base material film 2. The above-mentioned barrier layer 3 comprises the water repellent layer 3b on the both side surfaces, and the dense layer 3a in the central part.

In this embodiment, since the barrier layer has the water repellent layer deposited on the both side surfaces and the water repellent layers has a high carbon concentration and the water repellent property, the water repellent property can be improved on the surface so that the barrier property with respect to water (water vapor) can be improved on the both side surfaces. In contrast, since the dense layer is provided in the central part of the barrier layer and the dense layer is a dense layer having a low carbon concentration and a high oxygen concentration, the barrier property with respect to a gas such as an oxygen can be improved in the central part.

The water repellent layer and the dense layer comprising the above-mentioned barrier layer are, as mentioned above, a silicon oxide carbide film having a predetermined atomic percent Si:O:C, and in this embodiment, the barrier layer itself is a silicon oxide carbide film with the atomic percent Si:O:C changed continuously to the predetermined value.

Specifically, according to the barrier layer of this embodiment, the atomic percent Si:O:C in the area in the range from the outermost surface to 15 with the premise that the entire film thickness is defined to be 100 is preferably in a range of 100:40 to 120:80 to 160, it is more preferably in a range of 100.60 to 120:90 to 160, and it is particularly preferably in a range of 100:80 to 120:100 to 160. It is further preferably in a range of 100:100 to 110:100 to 110. By having the above-mentioned atomic percent in the range, an area with an extremely small number of the water vapor adsorption points can be obtained so that a high water vapor barrier property can be provided. Moreover, in the case the atomic percent in the above-mentioned area is outside the range, the water repellent property can be insufficient.

Moreover, according to the barrier layer of this embodiment, the atomic percent Si:O:C in the area in the range of the central part of 20 (the area from the central part to 10 each to the both surface side) with the premise that the entire film thickness is defined to be 100 is preferably in a range of 100:100 to 200:5 to 100, it is more preferably in a range of 100:120 to 200:10 to 80, and it is particularly preferably in a range of 100:140 to 200:10 to 60. By having the above-mentioned atomic percent in the range, a dense layer with a high density can be provided so that the barrier property with respect to a gas such as an oxygen can be improved. Moreover, in the case the atomic percent in the above-mentioned area is outside the range, the density can be insufficient so that a sufficient density cannot be obtained and the barrier property may be lowered.

Furthermore, according to the barrier layer in this embodiment, the atomic percent Si:O:C in the area in the range of the central part of 20 (the area from the central part to 10 each to the both side surface side) with the premise that the entire film thickness is defined to be 100 may be in a range of 100:100 to 150:50 to 100, and further, it may be in a range of 100:130 to 150:70 to 80.

According to the water repellent layer and the dense layer comprising the barrier layer used in this embodiment, for example as shown in FIG. 3, the dense layer 3a may be formed directly on the water repellent layer 3b, and although it is not shown in the figure, the dense layer may not be formed immediately above the water repellent layer. Since the barrier layer in this embodiment is a silicon oxide carbide film having the atomic percent Si:O:C changed continuously so as to have a predetermined value, in the case the dense layer is not formed immediately above the above-mentioned water repellent layer, a silicon oxide carbide film having the atomic percent Si:O:C changed continuously so as to have a predetermined value may be formed between the water repellent layer and the dense layer. As to the positional relationship between the above-mentioned dense layer and the water repellent layer formed on the dense layer, the same as the above-mentioned can be applied.

Fifth Embodiment

Next, a fifth embodiment of the barrier layer used in the present invention will be explained. The fifth embodiment of the barrier layer used in the present invention is a silicon oxide carbide film comprising a dense layer, a water repellent layer formed on the dense layer, and a dense layer formed on the water repellent layer, with the atomic percent of O (oxygen) with respect to Si (silicon) increased continuously from the central part in the thickness direction toward the both outer sides, and the atomic percent of C (carbon) with respect to Si (silicon) reduced from the central part in the thickness direction toward the both outer sides.

The barrier film of this embodiment will be explained with reference to the drawings. As shown in FIG. 4, a barrier film 1 comprises a base material film 2, and a barrier layer 3 formed on one side surface of the base material film 2. The above-mentioned barrier layer 3 comprises the dense layer 3a on the both side surfaces, and the water repellent layer 3b in the central part.

In this embodiment, since the barrier layer has the dense layer on the both side surfaces, and the dense layer is a layer having a low carbon concentration and a high oxygen concentration, the barrier property with respect to a gas such as an oxygen can be improved on the both side surfaces. In contrast, since the water repellent layer is provided in the central part of the barrier layer and the water repellent layer has a high carbon concentration and the water repellent property, the water repellent property can be improved in the central part so that the barrier property with respect to water (water vapor) can be improved.

The water repellent layer and the dense layer comprising the above-mentioned barrier layer are, as mentioned above, a silicon oxide carbide film having a predetermined atomic percent Si:O:C, and in this embodiment, the barrier layer itself is a silicon oxide carbide film with the atomic percent Si:O:C changed continuously to the predetermined value.

Specifically, according to the barrier layer of this embodiment, the atomic percent Si:O:C in the area in the range from the outermost surface to 15 with the premise that the entire film thickness is defined to be 100 is preferably in a range of 100:100 to 200:5 to 100, it is more preferably in a range of 100:120 to 200:10 to 80, and it is particularly preferably in a range of 100:140 to 200:10 to 60. By having the above-mentioned atomic percent in the range, a dense layer with a high density can be provided so that the barrier property with respect to a gas such as an oxygen can be improved. Moreover, in the case the atomic percent in the above-mentioned area is outside the range, the density can be insufficient so that a sufficient density cannot be obtained and the barrier property may be lowered.

Moreover, according to the barrier layer of this embodiment, the atomic percent Si:O:C in the area in the range of the central part of 20 (the area from the central part to 10 each to the both side surface side) with the premise that the entire film thickness is defined to be 100 is preferably in a range of 100:40 to 120:80 to 160, it is more preferably in a range of 100:60 to 120:90 to 160, and it is particularly preferably in a range of 100:80 to 120:190 to 160. By having the above-mentioned atomic percent in the range, an area with an extremely small number of the water vapor adsorption points can be obtained so that a high water vapor barrier property can be provided. Moreover, in the case the atomic percent in the above-mentioned area is outside the range, the water repellent property can be insufficient.

As to the positional relationship between the water repellent layer and the dense layer, since the same mentioned in the above-mentioned fourth embodiment can be applied, explanation is omitted here.

Sixth Embodiment

Next, a sixth embodiment of the barrier layer used in the present invention will be explained. The sixth embodiment of the barrier layer used in the present invention is a silicon oxide carbide film comprising a water repellent layer and a dense layer formed on the water repellent layer, with the atomic percent of O (oxygen) with respect to Si (silicon) increased continuously from the base material film side toward the outer side, and the atomic percent of C (carbon) with respect to Si (silicon) reduced from the base material film side toward the outer side.

The barrier film of this embodiment will be explained with reference to the drawings. As shown in FIG. 5, a barrier film 1 comprises a base material film 2, and a barrier layer 3 formed on one side surface of the base material film 2. The above-mentioned barrier layer 3 comprises the dense layer 3a on the surface side, and the water repellent layer 3b on the base material film 2 side.

In this embodiment, since the barrier layer has the dense layer on the surface side, and the dense layer is a layer having a low carbon concentration and a high oxygen concentration, the barrier property with respect to a gas such as an oxygen can be improved on the surface side. In contrast, since the water repellent layer is deposited on the base material film side of the barrier layer and the water repellent layer has a high carbon concentration and the water repellent property, the water repellent property can be improved on the base material film side so that the barrier property with respect to water (water vapor) can be improved.

As to the positional relationship between the water repellent layer and the dense layer, since the same mentioned in the above-mentioned fourth embodiment can be applied, explanation is omitted here.

Seventh Embodiment

Next, a seventh embodiment of the barrier layer used in the present invention will be explained. The seventh embodiment of the barrier layer used in the present invention is a silicon oxide carbide film comprising a dense layer, and a water repellent layer formed on the dense layer, with the atomic percent of O (oxygen) with respect to Si (silicon)

reduced continuously from the base material film side toward the outer side, and the atomic percent of C (carbon) with respect to Si (silicon) increased from the base material film side toward the outer side.

The barrier film of this embodiment will be explained with reference to the drawings. As shown in FIG. 1, a barrier film 1 comprises a base material film 2, and a barrier layer 3 formed on one side surface of the base material film 2. The above-mentioned barrier layer 3 comprises the water repellent layer 3b on the surface side, and the dense layer 3b on the base material film 2 side.

In this embodiment, since the barrier layer has the water repellent layer on the surface side and the water repellent layer has a high carbon concentration and the water repellent property, the water repellent property can be improved on the surface side so that the barrier property with respect to water (water vapor) can be improved. In contrast, since the dense layer is deposited on the base material film side of the barrier layer, and the dense layer is a layer having a low carbon concentration and a high oxygen concentration, the barrier property with respect to a gas such as an oxygen can be improved on the base material film side.

As to the positional relationship between the water repellent layer and the dense layer, since the same mentioned in the above-mentioned fourth embodiment can be applied, explanation is omitted here.

2. Base Material Film

Next, the base material film used in the present invention will be explained. The base material film used in the present invention is not particularly limited as long as it is a film capable of supporting the above-mentioned barrier layer, or the above-mentioned barrier layer and a resin layer to be described later, or the like, having a post processing suitability, and it can be selected optionally according to the purpose of the usage of the barrier film, or the like.

Specifically, as the base material film, an oriented (uniaxial or biaxial) or unoriented transparent film of a polyolefin based resin such as a polyethylene, a polypropylene, and a polybutene; an amorphous polyolefin based resin such as a cyclic polyolefin; a (meta) acrylic based resin; a polyvinyl chloride based resin; a polystyrene based resin; an ethylene-vinyl acetate copolymer saponified product; a polyvinyl alcohol based resin such as a polyvinyl alcohol resin, and an ethylene-vinyl alcohol copolymer; a polycarbonate based resin; a polyvinyl butylate resin; a polyallylate resin; a fluorine based resin such as an ethylene-ethylene tetrafluoride copolymer, an ethylene trifluoride chloride, an ethylene tetrafluoride-perfluoro alkyl vinyl ether copolymer, a vinylidene fluoride, a vinyl fluoride, and a perfluoroperphloro propylene-perphloro vinyl ether copolymer; a polyvinyl acetate based resin; an acetal based resin; a polyester based resin such as a polyethylene terephthalate (PET), and a polyethylene 2,6-naphthalate (PEN); a polyamnide based resin such as a nylon (product name) 6, a nylon (product name) 12, and a copolymer nylon (product name); a polyimide resin; a polyether imide resin; a polysulfon resin; a polyether sulfon resin; a polyether ether ketone resin, or the like, can be used.

The thickness of the above-mentioned base material film can be set optionally in a range of 5 μm to 500 μm, preferably in a range of 10 μm to 200 μm.

3. Resin Layer

Figure 6:
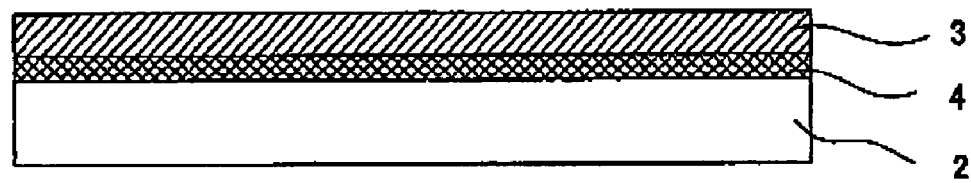
FIG. 6 is a schematic cross sectional view showing another example of a barrier film of the present invention.
Figure 7:
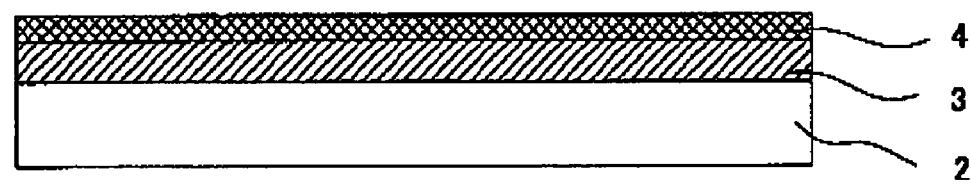
FIG. 7 is a schematic cross sectional view showing another example of a barrier film of the present invention.

The barrier film of the present invention may have a resin layer. For example, as shown in FIG. 6, the resin layer 4 may be formed between the base material film 2 and the barrier layer 3, or for example, as shown in FIG. 7, the resin layer 4 may be formed on the barrier layer 3. The former resin layer is for improving the close contact property between the base material film and the barrier layer, and also for improving the barrier property. Moreover, the latter resin layer is for providing the heat stability, the chemical resistance and the weather resistance to the barrier film by functioning as a protection film, and also for improving the barrier property by compensating the defects in the barrier layer if there is any of that.

Moreover, in FIG. 6, although the resin layer 4 is formed on one side surface of the base material film 1, the resin layer and the barrier layer may be laminated on the both side surfaces of the base material film in this order. Furthermore, the lamination of the resin layer and the barrier layer may be repeated by two or more times for the formation.

Furthermore, in FIG. 7, although the resin layer 4 is formed on one side surface of the base material film 1, also in this case, the barrier layer and the resin layer may be laminated on the both side surfaces of the base material film in this order. Moreover, the lamination of the barrier layer and the resin layer may be repeated by two or more times for the formation.

Such a resin layer can be formed with one kind or a combination of two or more kinds selected from the group consisting of a commercially available resin material such as a polyamic acid, a polyethylene resin, a melamine resin, a polyurethane resin, a polyester resin, a polyol resin, a polyurea resin, a polyazo metine resin, a polycarbonate resin, a polyacrylate resin, a polystyrene resin, a polyacrylonitrile resin, and a polyethylene naphthalate resin, a hardening type epoxy resin containing a high molecular weight epoxy polymer as a polymer of bifunctional epoxy resins and bifunctional phenols, a resin material used for the above-mentioned base material film, an anchor coating agent used for the laminating material to be described later, an adhesive, a heat sealable resin material, or the like. Among the above-mentioned examples, it is preferable to use a urethane acrylate based resin material because the urethane acrylate based resin material has the plasma (etching) resistance and the excellent close contact property.

It is preferable that the thickness of the above-mentioned resin layer is set optionally according to the material to be used. For example, it can be set in a range of about 5 nm to $5 \times 10^5$ nM.

Moreover, according to the present invention, the resin layer may contain a non fibrous inorganic filler having the average particle size in a range of 0.8 to 5 μm. As the non fibrous inorganic filler to be used, an aluminum hydroxide, a magnesiun hydroxide, a talc, an alumina, a magnesia, a silica, a titanium dioxide, a clay, or the like can be used preferably. Such an inorganic filler can be contained in a range of 10 to 60% by weight of the resin layer, preferably in a range of 25 to 45% by weight.

4. Barrier Film

The oxygen transmission rate (OTR) of the barrier film of the present invention is preferably 3 $cc/m^2/day \cdot atm$ or less, and it is particularly preferably 1 $cc/m^2/day \cdot atm$ or less. In contrast, the water vapor transmission rate (WVTR) is preferably 3 $g/m^2/day$ or less, and it is particularly preferably 1 $g/m^2/day$ or less.

5. Production Method for the Barrier Film

Next, the production method for the barrier film of the present invention will be explained. The barrier film of the present invention can be produced by forming a barrier layer on the base material film by the chemical vapor deposition method (CVD method). In the present invention, the production method for the barrier film differs depending on the configuration of the above-mentioned barrier layer. It can be classified into the case of the barrier layer comprising a water repellent layer and a dense layer, with the water repellent layer and the dense layer contacted directly (first embodiment), and the case of the barrier layer comprising a water repellent layer and a dense layer, as a silicon oxide carbide film having the atomic percent Si:O:C changed continuously (second embodiment). Hereinafter, each embodiment will be explained.

(1) First Embodiment

A first embodiment of the production method for the barrier film of the present invention is a method used in the case the above-mentioned barrier layer comprises a water repellent layer and a dense layer, with the water repellent layer and the dense layer contacted directly. According to the present invention, by forming the water repellent layer and the dense layer individually, the barrier layer can be formed such that the water repellent layer and the dense layer are contacted directly.

Hereinafter, the method for forming the water repellent layer and the method for forming the dense layer will be explained.

(Method for Forming the Water Repellent Layer)

In this embodiment, the water repellent layer as a silicon oxide carbide film can be formed by the CVD method, using an organic silicon compound having a carbon-silicon bond in the molecule. By using a gas of the organic silicon compound, the water repellent layer as a silicon oxide carbide film having the above-mentioned atomic percent Si:O:C can be formed.

In this embodiment, the water repellent layer is formed by the CVD method, and it is particularly preferably formed by the plasma enhanced CVD method.

Moreover, as the organic silicon compound having a carbon-silicon bond in the molecule used in this embodiment, an organic silicon compound having a carbon-silicon bond in the molecule, and containing 4 or more of C (carbon) is preferable because such an organic silicon compound has the high stability and the good handling property. As the above-mentioned organic silicon compound having a carbon-silicon bond in the molecule and containing 4 or more of C (carbon), for example, a hexamethyldisiloxane (HMDSO), a tetramethyldisiloxane (TMDSO), a tetramethylsilane(TMS), or the like can be presented. In particular, the hexamethyldisiloxane can be used most preferably.

Moreover, at the time of the formation of the above-mentioned water repellent layer, the film formation is executed by using a gas of the above-mentioned organic silicon compound in the presence of a nitrogen gas, an oxygen gas, an argon gas, a helium gas, a carbon dioxide gas, or the like.

(Method for Forming the Dense Layer)

In this embodiment, the dense layer as a silicon oxide carbide film can be formed by the CVD method, using an organic silicon compound containing an alkoxide having an oxygen-silicon bond in the molecule. By using a gas of the organic silicon compound, the dense layer as a silicon oxide carbide film having the above-mentioned atomic percent Si:O:C can be formed.

In this embodiment, the dense layer is formed by the CVD method, and it is particularly preferably formed by the plasma enhanced CVD method.

As the above-mentioned organic silicon compound containing an alkoxide having an oxygen-silicon bond in the molecule, a tetramethoxysilane (TMOS), a tetraethoxysilane (TEOS), a tetra-iso-propoxysilane, a tetra-n-propoxysilane, a tetra-n-butoxysilane, a tetra-sec-butoxysilane, a tetra-tert-butoxysilane, a tetrapentaethoxysilane, a tetrapenta-iso-propoxysilane, a tetrapenta-n-propoxysilane, a tetrapenta-n-butoxysilane, a tetrapenta-sec-butoxysilane, a tetrapenta-tert-butoxysilane, a methyltrimethoxysilane, a methyltriethoxysilane, a methyltripropoxysilane, a methyltributoxysilane, a dimethyldimethoxysilane, a dimethyldiethoxysilane, a dimethylethoxysilane, a dimethylmethoxysilane, a dimethylpropoxysilane, a dimethylbutoxysilane, a methyldimethoxysilane, a methyldiethoxysilane, a hexyltrimethoxysilane, a trimethoxysilane, an ethyltriethoxysilane, a diethyldiethoxysilane, a methylethyldiethoxysilane, or the like can be presented. In particular, it is preferable to use a trimethoxysilane, a tetramethoxysilane (TMOS), a methyltrimethoxysilane, a dimethyldimethoxysilane, a tetraethoxysilane (TEOS), an ethyltriethoxy silane, a methyltriethoxysilane, a diethyldiethoxysilane, a methylethyldiethoxysilane, or the like, and a tetramethoxysilane (TMOS) can be used most preferably.

Moreover, at the time of the formation of the above-mentioned dense layer, the film formation is executed by using a gas of the above-mentioned organic silicon compound in the presence of a nitrogen gas, an oxygen gas, an argon gas, a helium gas, a carbon dioxide gas, or the like.

(Production Method for the Barrier Film)

Figure 8:
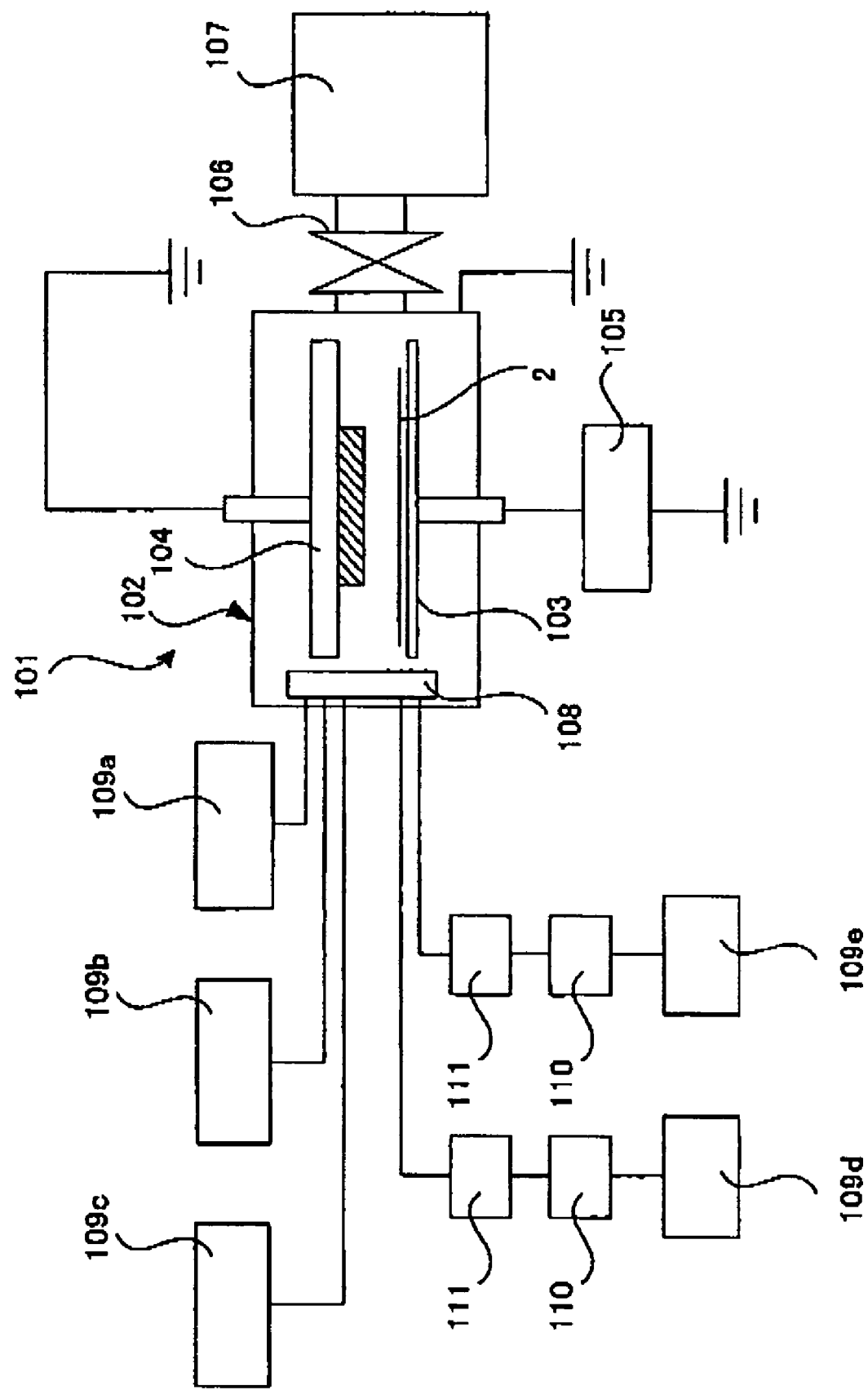
FIG. 8 is a schematic diagram showing an example of a plasma CVD coating device used in the present invention.

FIG. 8 is a structure diagram showing an example of a plasma enhanced CVD device used in this embodiment. In FIG. 8, the plasma enhanced CVD device 101 comprises a chamber 102, a lower part electrode 103 disposed in the chamber 102, an upper part electrode 104, a plasma generating device 105 connected with the lower part electrode 103, an exhausting device 107 such as an oil rotary pump and a turbo molecular pump, connected with the chamber 102 via an exhausting valve 106, and a gas inlet opening 108 for introducing a material gas to the chamber 102. The above-mentioned gas inlet opening 108 is connected with material gas supply sources 109a, 109b, 109c and it is connected with organic silicon compound supply sources 109d, 109e via a monomer flow rate meter 110, and a vaporizing device 111.

Next, the production method for the barrier film, using the plasma enhanced CVD device will be explained. Here, an example of the case of forming the barrier layer with the water repellent layer, the dense layer and the water repellent layer laminated will be presented.

After mounting the base material film 2 on the lower part electrode 103 with the surface to have the film formation disposed to the upper side, the inside of the chamber 102 is reduced by the exhausting device 107 to a predetermined vacuum pressure, and an electric power having a predetermined frequency is input to the lower part electrode 103. Then, the material gas supplied from the material gas supply sources 109a, 109b, 109c, and the material gas supplied from the organic silicon compound supply sources 109d, 109e via the monomer flow rate meter 110 and the vaporizing device 111 are introduced from the gas inlet opening 108 into the chamber 102. By controlling the opening degree of the exhausting valve 106 between the exhausting device 107 and the chamber 102, the inside of the chamber 102 is maintained at a predetermined pressure. Thereby, the introduced material gas is made to be a plasma between the lower part electrode 103 and the upper part electrode 104 so as to be adhered on the base material film 2 for forming the barrier layer.

According to the barrier layer formation, first, the water repellent layer is formed on the base material film 2, using a gas containing an organic silicon compound having a carbon-silicon bond in the molecule, and containing 4 or more of C (carbon) as the material gas to be supplied from the organic silicon compound supply source 109d via the monomer flow rate meter 110 and the vaporizing device 111. Here, the main material denotes one with the content ratio of 50% by volume or more, Next, the dense layer is formed on the above-mentioned water repellent layer, using a gas containing as the main material an organic silicon compound containing an alkoxide having an oxygen-silicon bond in the molecule as the material gas to be supplied from the organic silicon compound supply source 109e via the monomer flow rate meter 110 and the vaporizing device 111.

Furthermore, the water repellent layer is formed on the above-mentioned dense layer, using a gas containing as the main material an organic silicon compound having a carbon-silicon bond in the molecule and containing 4 or more of C (carbon), with an electric power higher than the electrode input tolerance electric power at the time of forming the above-mentioned water repellent layer and dense layer applied to the lower part electrode 103. Although the organic silicon compound containing an alkoxide having an oxygen-silicon bond in the molecule can be decomposed easily by the oxygen-silicon bond, it has a worse film forming property compared with the organic silicon compound having a carbon-silicon bond in the molecule, and containing 4 or more of C (carbon) so that the plasma discharge voltage is lowered due to the existence of the decomposed product of the organic silicon compound containing an alkoxide having an oxygen-silicon bond in the above-mentioned molecule in the plasma atmosphere. Therefore, the electric power to be applied to the lower part electrode can be made higher at the time of forming the water repellent layer in the uppermost surface. In contrast, although the organic silicon compound having a carbon-silicon bond in the molecule, and containing 4 or more of C (carbon) has a worse decomposing property compared with the organic silicon compound containing an alkoxide having an oxygen-silicon bond in the molecule, the plasma formation is promoted by inputting the high electric power as mentioned above so that a dense water repellent layer having a high water repellent property can be formed. Moreover, since the above-mentioned decomposed product of the organic silicon compound containing an alkoxide having an oxygen-silicon bond in the molecule is present in the plasma atmosphere so that the plasma electric discharge voltage is lowered, the Yi value (Yellowness index) as the index for the yellowness of the film can be made to 1 or less, an advantage of increase of the transparency can also be achieved.

Moreover, although the plasma enhanced CVD device shown in FIG. 8 is of a method for forming a film on a sheet like base material film, a winding up type plasma enhanced CVD device can also be used.

Figure 9:
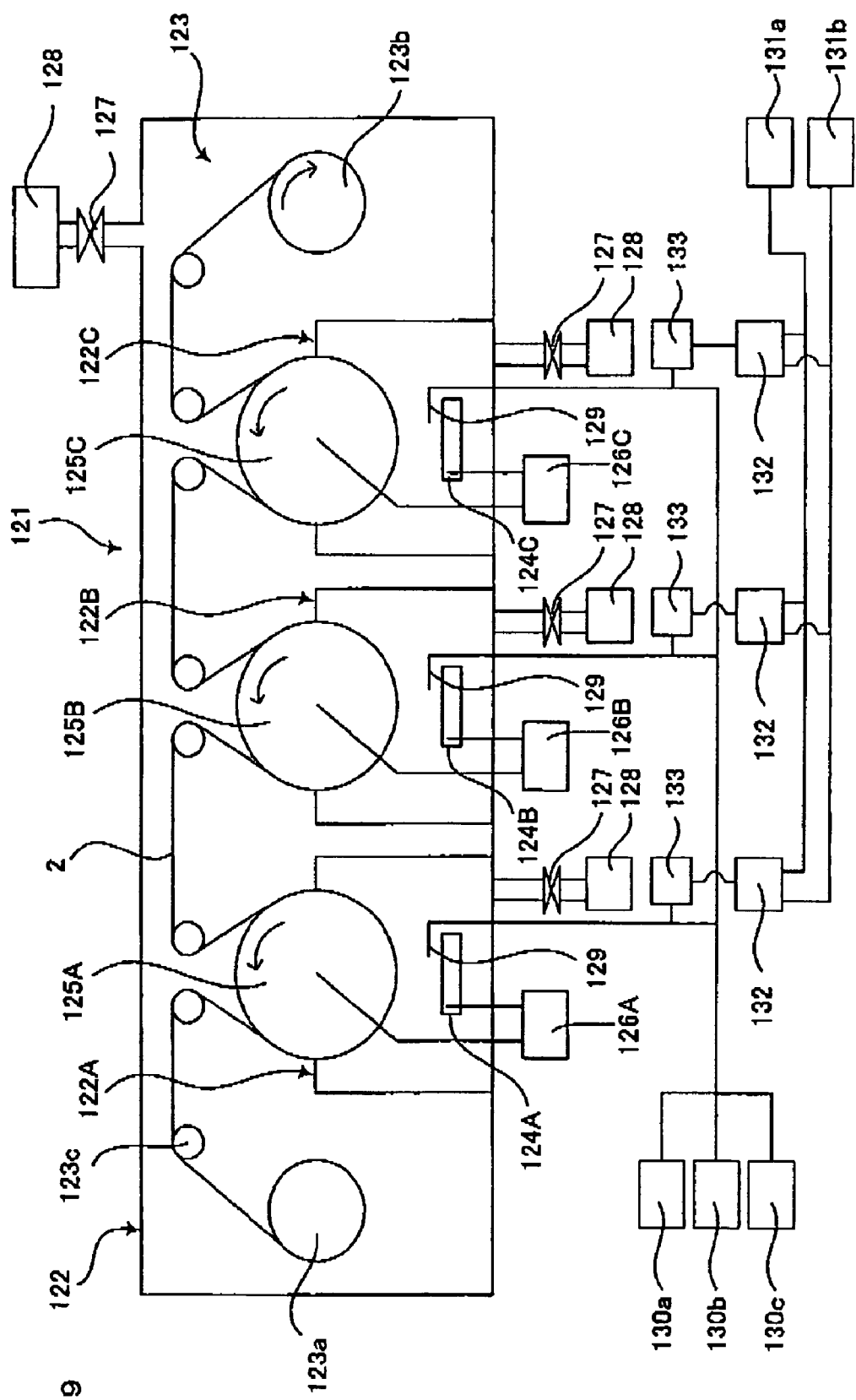
FIG. 9 is a schematic diagram showing another example of a plasma CVD coating device used in the present invention.

FIG. 9 is a structure diagram showing another example of a plasma enhanced CVD device used in the present invention. In FIG. 9, the plasma enhanced CVD device 121 comprises a chamber 122 having three film formation zones including a first film formation zone 122A, a second film formation zone 122B, and a third film formation zone 122C, and a winding system 123 having a feeding out roller 123a, a winding up roller 123b, and a guide roller 123c for conveying the base material film 2 in the chamber 122 from the first film formation zone 122A to the third film formation zone 122C. In each film formation zone 122A, 122B, 122C, lower part electrodes 124A, 124B, 124C and coating drums 125A, 125B, 125C, which serve also as the upper part electrodes are disposed, with the lower part electrodes and the coating drums (upper part electrodes) each connected with power supplies 126A, 126B, 126C. Moreover, in the chamber 122, an exhausting device 128 such as an oil rotary pump and a turbo molecular pump, connected via an exhausting valve 127 is installed, Furthermore, in each film formation zone 122A, 122B, 122C, the exhausting device 128 connected via the exhausting valve 127, and a gas inlet opening 129 for introducing the material gas into each film formation zone are installed. The above-mentioned gas inlet openings 129 are connected with the material gas supply sources 130a, 130b, 130c, they are connected with the organic silicon compound supply sources 131a, 13b via the monomer flow rate meter 132 and the vaporizing device 133, and they are connected with the organic silicon compound supply sources 131a, 131b via the monomer flow rate meter 132 and the vaporizing device 133.

Next, the production method for a barrier film using such a plasma enhanced CVD device will be explained. Here, an example the case of forming a barrier layer with a water repellent layer, a dense layer and a water repellent layer laminated will be explained, First, the base material film 2 is mounted on the winding system 123 in the plasma enhanced CVD device 121 with the surface to have the film formation disposed outside the coating drums 125A, 1252, 125C. Next, with the pressure of the inside of the chamber 122 reduced to a predetermined vacuum pressure by the exhausting devices 128, the electric power having a predetermined frequency is input to the lower part electrodes 124A, 124B, 124C and the coating drums (upper part electrodes) 125A, 125B, 125C of the three film formation zones 122A, 122B, 122C by the power supplies 126A, 126B, 126C. Then, by introducing the material gas (for example, an argon gas, a helium gas, and an oxygen gas) supplied from the material gas supply sources 130a, 130b, 130c and the material gas (organic silicon compound) supplied from the organic silicon compound supply sources 131a, 131b via the monomer flow rate meter 132 and the vaporizing device 133 from the gas inlet opening 129 for each film formation zone, and controlling the opening degree of the exhausting valve 127 provided between the exhausting device 128 and the film formation zones 122A, 122B, 122C , the inside of the film formation zones 122A, 1223, 122C is maintained at a predetermined pressure. Thereby, the introduced material gas is processed to be a plasma between the lower part electrodes 124A, 124B, 124C and the coating drums (upper part electrodes) 125A, 125B, 125C in the three film formation zones 122A, 122B, 122c. Then, the water repellent layer is formed in the first film formation zone 122A on the base material film 2 being conveyed, the dense layer is formed in the second film formation zone 122B, and the water repellent layer is formed in the third film formation zone 122C.

According to the film formation of the barrier layer, a gas containing an organic silicon compound containing an alkoxide having an oxygen-silicon bond in the molecule as the main material is used in the second film formation zone 122B, and a gas containing an organic silicon compound having a carbon-silicon bond in the molecule, and containing 4 or more of C (carbon) as the material gas is used in the first film formation zone 122A and the third film formation zone 122C. Then, in the third film formation zone 122C, an electric power higher than the electrode input tolerance electric power in the third film formation zone 122C at the time of forming the same member to have the film formation (base material film) is applied between the lower part electrode 124C and the coating drum (upper part electrode) 125C by the power supply 126C, using only a gas containing an organic silicon compound having a carbon-silicon bond in the molecule, and containing 4 or more of C (carbon) in the all film formation zone from the first film formation zone 122A to the third film formation zone 122C. According to the high input electric power in the third film formation zone 122C, the plasma treatment process of the organic silicon compound having a carbon-silicon bond in the molecule, and containing 4 or more of C (carbon) is promoted in the third film formation zone so that a dense water repellent layer having a high water repellent property can be formed.

The production method for a barrier film of this embodiment is a method used for the case wherein the barrier layer comprises a water repellent layer and a dense layer, with the water repellent layer and the dense layer contacted directly. According to the above-mentioned plasma enhanced CVD device shown in FIGS. 8 and 9, although the case of the barrier layer with the water repellent layer, the dense layer and the water repellent layer laminated in this order has been explained, for example, in the case the barrier layer has the dense layer, the water repellent layer and the dense layer laminated, by changing the order of using a gas containing an organic silicon compound having a carbon-silicon bond in the molecule, and containing 4 or more of C (carbon) as the material gas used for forming the water repellent layer, and a gas containing an organic silicon compound containing an alkoxide having an oxygen-silicon bond in the molecule as the main material gas used for forming the dense layer in the above-mentioned plasma enhanced CVD device, the dense layer, the water repellent layer and the dense layer can be formed in this order on the base material film. According to this embodiment, by changing the order of using the above-mentioned two kinds of the gases containing an organic silicon compound as the main material, for example, the dense layer and the water repellent layer can be formed in this order on the base material film, or the water repellent layer and the dense layer can be formed in this order.

Moreover, according to this embodiment, the barrier layer may be laminated and formed by two or more layers. In this case, the above-mentioned process may be repeated two or more times, moreover, a plasma enhanced CVD device having a chamber comprising a plurality of film formation zones may be used.

The production method for a barrier film of this embodiment can be used preferably for forming the barrier layer explained in the first to third embodiments of the above-mentioned "1. Barrier layer".

(2) Second Embodiment

Next, a second embodiment of the production method for the barrier film of the present invention will be explained. The second embodiment of the production method for the barrier film of the present invention is the case wherein the above-mentioned barrier layer comprising a water repellent layer and a dense layer, is a silicon oxide carbide film with the atomic percent Si:O:C changed continuously. According to this embodiment, by inputting an organic silicon compound having a carbon-silicon bond in the molecule and an organic silicon compound containing an alkoxide having an oxygen-silicon bond in the molecule and using the CVD method, a silicon oxide carbide film having the above-mentioned configuration can be formed on the base material film.

According to this embodiment, the barrier layer is formed by the CVD method, and in particular, it is formed preferably by the plasma enhanced CVD method.

As to the organic silicon compound having a carbon-silicon bond in the molecule, and an organic silicon compound containing an alkoxide having an oxygen-silicon bond in the molecule, since they are same as those mentioned in the above-mentioned first embodiment, explanation is omitted here.

In this embodiment, at the time of forming a silicon oxide carbide film with the atomic percent Si:O:C changed continuously to have a predetermined value, using the above-mentioned two kinds of the gases, the method for changing the ratios of the number of atoms of O (oxygen) and C (carbon) with respect to Si (silicon) continuously can be selected optionally from the methods for forming a barrier layer. For example, in the case of forming by the batch method, a method of changing the mole ratios of the above-mentioned two kinds of the gases can be used. Moreover, in the case of forming by the continuous method, a method of changing the position of the gas inlet opening for the above-mentioned two kinds of the organic silicon compound, and a method of changing the film formation position can be used.

Here, the method for forming a silicon oxide carbide film having the atomic percent Si:O:C changed continuously to have a predetermined value by changing the mole ratios of the above-mentioned two kinds of the gases will be explained. For example, in the case of forming a barrier layer as a silicon oxide carbide film having a dense layer and a water repellent layer, with the atomic percent of O (oxygen) with respect to Si (silicon) reduced from the base material film side toward the outer side, and the atomic percent of C (carbon) with respect to Si (silicon) increased from the base material film side toward the outer side, first, by forming a film by introducing a gas having an organic silicon compound containing an alkoxide having an oxygen-silicon bond in the molecule as the main material, and forming a film by introducing a gas having an organic silicon compound having a carbon-silicon bond in the molecule, and containing 4 or more of C (carbon) as the main material, the barrier layer having the above-mentioned configuration can be formed. Accordingly, by changing the mole ratio such that the mole ratio of the gas having a carbon-silicon bond in the molecule, and containing 4 or more of C (carbon) as the main material with respect to the gas having an organic silicon compound containing an alkoxide having an oxygen-silicon bond in the molecule as the main material is increased gradually, the barrier layer having the above-mentioned configuration can be formed.

Moreover, in the case the above-mentioned barrier layer is a silicon oxide carbide film comprising a water repellent layer and a dense layer, with the atomic percent of O (oxygen) with respect to Si (silicon) increased from the base material film side toward the outer side, and the atomic percent of C (carbon) with respect to Si (silicon) reduced from the base material film side toward the outer side, by changing the mole ratio such that the mole ratio of the gas having an organic silicon compound containing an alkoxide having an oxygen-silicon bond in the molecule as the main material with respect to the gas having a carbon-silicon bond in the molecule, and containing 4 or more of C (carbon) as the main material is increased gradually, the barrier layer having the above-mentioned configuration can be formed.

Furthermore, for example, in the case of forming a barrier layer as a silicon oxide carbide film having a water repellent layer, a dense layer and a water repellent layer in this order, with the atomic percent of O (oxygen) with respect to Si (silicon) reduced from the central part in the thickness direction toward the both outer sides, and the atomic percent of C (carbon) with respect to Si (silicon) increased from the central part in the thickness direction toward the both outer sides, by changing the mole ratio such that the mole ratio of the gas having an organic silicon compound containing an alkoxide having an oxygen-silicon bond in the molecule as the main material with respect to the gas having a carbon-silicon bond in the molecule, and containing 4 or more of C (carbon) as the main material is increased gradually and then reduced gradually, the barrier layer having the above-mentioned configuration can be formed.

Moreover, in the case of forming a barrier layer as a silicon oxide carbide film having a dense layer, a water repellent layer and a dense layer in this order, with the atomic percent of O (oxygen) with respect to Si (silicon) increased from the central part in the thickness direction toward the both outer sides, and the atomic percent of C (carbon) with respect to Si (silicon) reduced from the central part in the thickness direction toward the both outer sides, by changing the mole ratio such that the mole ratio of the gas having a carbon-silicon bond in the molecule, and containing 4 or more of C (carbon) as the main material with respect to the gas having an organic silicon compound containing an alkoxide having an oxygen-silicon bond in the molecule as the main material is increased gradually, and then reduced gradually, the barrier layer having the above-mentioned configuration can be formed.

According to this embodiment, particularly in the case the above-mentioned barrier layer is a silicon oxide carbide film having a water repellent layer, a dense layer and a water repellent layer in this order, with the atomic percent of O (oxygen) with respect to Si (silicon) reduced from the central part in the thickness direction toward the both outer sides, and the atomic percent of C (carbon) with respect to Si (silicon) increased from the central part in the thickness direction toward the both outer sides, it is preferable to input the above-mentioned two kinds of the gases at the same time. Thereby, a plurality of kinds of chambers of film formation zones, which are required for providing the water repellent layer and the dense layer individually can be eliminated so that the barrier film can be produced efficiently. Moreover, also an advantage of having the Yi value (Yellowness index) as the index for the yellowness can be made to 1 or less so that the transparency can be increased can be provided by inputting the above-mentioned two kinds of the gases at the same time.

At the time, as to the mole ratio of the above-mentioned two kinds of the gases, with the premise that the above-mentioned organic silicon compound having a carbon-silicon bond in the molecule and containing 4 or more of C (carbon) is 1, the number of mole of the above-mentioned organic silicon compound containing an alkoxide having an oxygen-silicon bond in the molecule is preferably in a range of 0.01 to 5, and it is particularly preferably in a range of 0.5 to 1. By having the number of mole in the above-mentioned range, a barrier layer having the high gas barrier property and water vapor barrier property can be provided.

At the time of forming the above-mentioned barrier layer, the film formation is carried out while using the above-mentioned two kinds of the organic silicon compounds at the same time in the presence of a nitrogen gas, an oxygen gas, an argon gas, a helium gas, or the like.

Next, the production method for the barrier film using the plasma enhanced CVD device used in this embodiment will be explained. Here, an example of forming a barrier layer as a silicon oxide carbide film having a water repellent layer, a dense layer and a water repellent layer in this order, with the atomic percent of O (oxygen) with respect to Si (silicon) reduced from the central part in the thickness direction toward the both outer sides, and the atomic percent of C (carbon) with respect to Si (silicon) increased from the central part in the thickness direction toward the both outer sides will be explained.

In this embodiment, the plasma enhanced CVD device shown in FIG. 8 disclosed in the above-mentioned first embodiment can be used. At the time, for the barrier layer formation, by using a gas having a carbon-silicon bond in the molecule, and containing 4 or more of C (carbon) as the main material and a gas containing an alkoxide having an oxygen-silicon bond in the molecule as the main material at the same time as the material gas to be supplied from the organic silicon compound supply sources 109*d*, 109*e* via the monomer flow rate meter 110 and the vaporizing device 111, a barrier layer having a water repellent layer and a dense layer is formed on the base material film 2.

Figure 10:
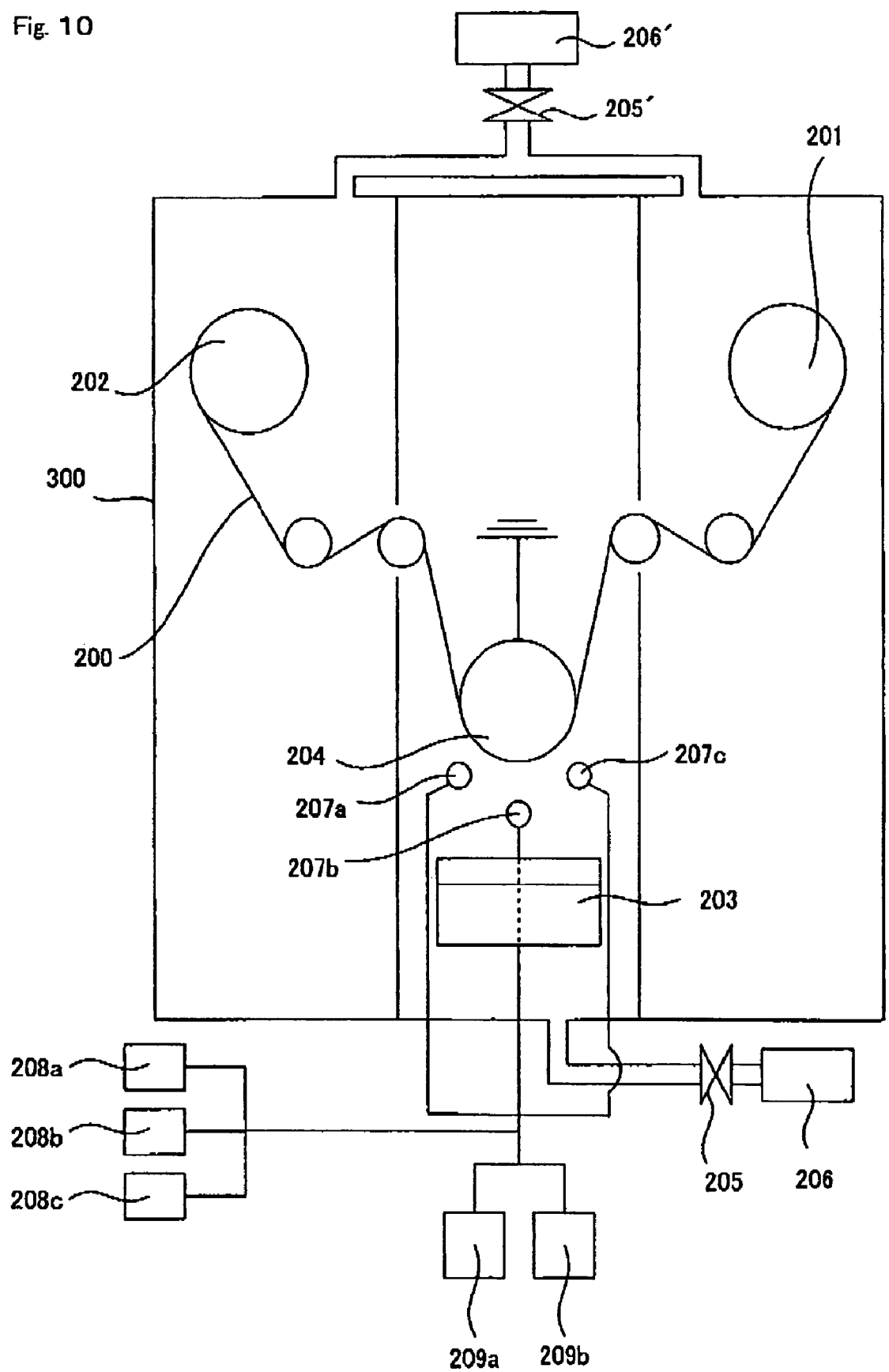
FIG. 10 is a schematic diagram showing another example of a plasma CVD coating device used in the present invention.

FIG. 10 is a structure diagram showing another example of a plasma enhanced CVD device used in this embodiment. In FIG. 10, the plasma enhanced CVD device comprises a chamber 300, and a winding system having a feeding out roller 201, a winding up roller 202, and a guide roller for conveying a base material film 200 in the chamber 300. In the film formation zone, a lower part electrode 203 and a coating drum (upper part electrode) 204, which serves also as the upper part electrode are connected with a power supply. Moreover, in the chamber 300, an exhausting device 206' such as such as an oil rotary pump and a turbo molecular pump connected via an exhausting valve 205' is installed. Furthermore, in the film formation zone, an exhausting device 206 such as an oil rotary pump and a turbo molecular pump connected via an exhausting valve 205, and gas inlet openings 207*a*, 207*b*, 207*c* for introducing the material gas into the film formation zone are installed. The above-mentioned gas inlet openings 207*a*, 207*b*, 207*c* are connected with material gas supply sources 208*a*, 208*b*, 208*c*, and they are connected also with organic silicon compound supply sources 209*a*, 209*b* via a monomer flow rate meter and a vaporizing device.

Next, the production method for a barrier film, using such a plasma enhanced CVD device will be explained.

First, the base material film 200 is mounted on winding system of the plasma enhanced CVD device with the surface to have the film formation disposed outside the coating drum 204. Next, with the pressure of the inside of the chamber 300 reduced to a predetermined vacuum pressure by the exhausting device 206', the electric power having a predetermined frequency is input to the lower part electrode 203 and the coating drum (upper part electrode) 204 by the power supply. Then, by introducing the material gas (for example, an argon gas, a helium gas, and an oxygen gas) supplied from the material gas supply sources 208*a*, 208*b*, 208*c* and the material gas (organic silicon compound) supplied from the organic silicon compound supply sources 209*a*, 209*b* via the monomer flow rate meter and the vaporizing device from the gas inlet openings 207*a*, 207*b*, 207*c*, and controlling the opening degree of the exhausting valve 205 provided between the exhausting device 206 and the film formation zone, the inside of the film formation zone is maintained at a predetermined pressure. Thereby, the introduced material gas is processed to be a plasma between the lower part electrode 203 and the coating drum (upper part electrode) 204 in the film formation zone. Then, the barrier layer is formed on the base material film 200 being conveyed.

According to the film formation of the barrier layer, with a gas containing an organic silicon compound containing an alkoxide having an oxygen-silicon bond in the molecule as the main material and a gas containing an organic silicon compound having a carbon-silicon bond in the molecule, and containing 4 or more of C (carbon) as the material gas used simultaneously, an electric power higher than the electrode input tolerance electric power in the film formation zone at the time of forming the same member to have the film formation (base material film) is applied between the lower part electrode and the coating drum (upper part electrode) by the power supply. According to the high input electric power in the film formation zone, the plasma treatment process of the organic silicon compound having a carbon-silicon bond in the molecule, and containing 4 or more of C (carbon) is promoted in the film formation zone so that a dense water repellent layer having a high water repellent property can be formed.

Moreover, according to this embodiment, the barrier layer may be laminated and formed by two or more layers. In this case, the above-mentioned process may be repeated two or more times, moreover, a plasma enhanced CVD device having a chamber comprising a plurality of film formation zones may be used.

The production method for a barrier film of this embodiment can be used preferably for forming the barrier layer explained in the fourth to seventh embodiments of the above-mentioned "1. Barrier layer".

(3) Others

In the present invention, a resin layer may be formed between the base material film and the barrier layer, or a resin layer may be formed on the barrier layer.

For the formation of the resin layer, a common method can be used. Examples include a dry formation method such as a physical vapor deposition, a sputtering, an ion plating and a CVD method, and a wet formation method of coating by a roll coating, a gravure coating, a knife coating, a dip coating, and a spray coating, and drying and eliminating a solvent, a diluting agent, or the like. The formation method can be selected optionally according to the material to be used, or the like. Moreover, the barrier layer formation and the resin layer formation can be executed in the same film forming device in line by forming the resin layer by the CVD method.

B. Laminated Material

Next, the laminated material of the present invention will be explained.

The laminated material of the present invention has a heat sealable resin layer deposited on at least one side surface of the above-mentioned barrier film.

Figure 11:
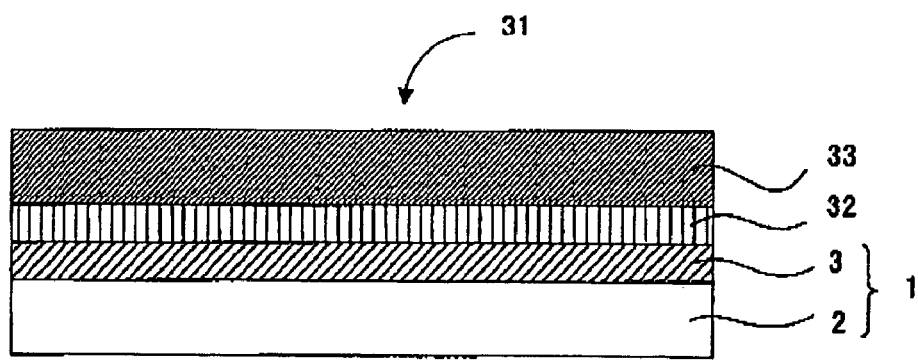
FIG. 11 is a schematic cross sectional view showing an example of a laminated material of the present invention.

FIG. 11 shows an example of a laminated material of the present invention using the above-mentioned barrier film 1. In FIG. 11, the laminated material 31 comprises a heat sealable resin layer 33 formed via an anchor coating agent layer and/or an adhesive layer 32 on a barrier layer 3 formed on one side surface of the base material film 2.

The anchor coating agent layer 32 comprising the above-mentioned laminated material 31 can be formed using for example an organic titanium based anchor coating agent such as an alkyl titanate, an isocyanate based anchor coating agent, a polyethylene imine based anchor coating agent, a polybutadiene based anchor coating agent, or the like. The above-mentioned anchor coating agent layer can be formed by coating the above-mentioned anchor coating agent by a common coating method such as a roll coating, a gravure coating, a knife coating, a dip coating, and a spray coating, and drying and eliminating a solvent, a diluting agent, or the like. The coating amount of the above-mentioned anchor coating agent is preferably about 0.1 to 5 $g/m^2$ (dry condition).

Moreover, the adhesive layer 32 comprising the above-mentioned laminated material 31 can be formed using for example various kinds of laminating adhesives of a solvent type, a water based type, a non solvent type, a thermally fusible type, or the like containing as the main component a vehicle such as a polyurethane based, polyester based, polyamide based, epoxy based, polyacrylic based, polyvinyl acetate based, polyolefin based, casein, a wax, an ethylene-acrylic acid copolymer, and a polybutadiene based. The above-mentioned adhesive layer can be formed by coating the above-mentioned laminating adhesive by a roll coating, a gravure coating, a knife coating, a dip coating, and a spray coating, or another coating method, and drying and eliminating a solvent, a diluting agent, or the like. The coating amount of the above-mentioned laminating adhesive is preferably about 0.1 to 5 $g/m^2$ (dry condition).

Furthermore, as the heat sealable resin used for the heat sealable resin layer 33 comprising the above-mentioned laminated material 31, a resin to be melted and fusible with each other can be presented. Specifically, an acid modified polyolefin resin, a polyvinyl acetate based resin, a polyacrylic based resin, a polyvinyl chloride based resin produced by modifying a low density polyethylene, a middle density polyethylene, a high density polyethylene, a straight chain like (linear) low density polyethylene, a polypropylene, an ethylene-vinyl acetate copolymer, an ionomer resin, an ethylene-acrylic acid copolymer, an ethylene-methacrylic acid methyl copolymer, an ethylene-propylene copolymer, a methyl pentene polymer, a polybutene polymer, a polyethylene, or the like by an unsaturated carboxylic acid such as an acrylic acid, a methacrylic acid, a maleic acid, a maleic anhydride, a fumaric acid, an itaconic acid, or the like, can be used.

The above-mentioned heat sealable resin layer can be formed by coating the above-mentioned heat sealable resin, or it can be formed by laminating a film or a sheet made of the above-mentioned heat sealable resin. The thickness of the heat sealable resin layer can be set in a range of 5 to 300 μm, preferably in a range of 10 to 100 μm.

Figure 12:
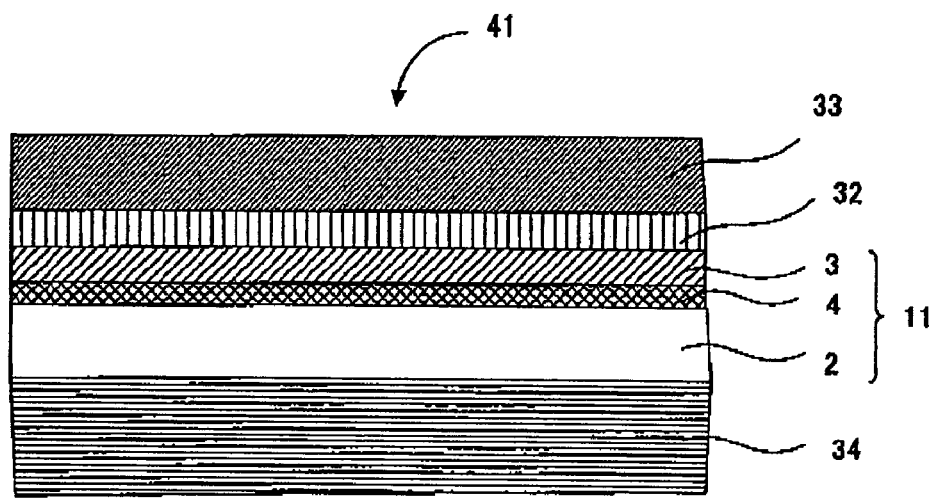
FIG. 12 is a schematic cross sectional view showing another example of a laminated material of the present invention.

FIG. 12 shows another example of a laminated material of the present invention using the above-mentioned barrier film 1. In FIG. 12, the laminated material 41 comprises a barrier film 1 having a barrier layer 3 via a resin layer 4 on one side surface of the base material film 2, a heat sealable resin layer 33 formed via an anchor coating layer and/or an adhesive layer 32 on the barrier layer 3 of the barrier film 1, and a base material 34 deposited on the other side surface (surface without the resin layer formation) of the base material film 2 of the barrier film 1.

As the anchor coating agent layer, the adhesive layer and the heat sealable resin layer comprising the above-mentioned laminated material 41, the same anchor coating agent layer, adhesive layer and heat sealable resin layer comprising the above-mentioned laminated material 31 can be used, and explanation is omitted here.

Moreover, as the base material 34 comprising the above-mentioned laminated material 41, for example, in the case the laminated material 41 is used for providing a packaging container, since the base material 34 provides the basic base material, a resin film or sheet having the excellent mechanical, physical, chemical characteristics, or the like, in particular, those durable and having the strength and the heat stability can be used. Specifically, an oriented (uniaxial or biaxial) or unoriented film or sheet of a durable resin such as a polyester based resin, a polyamide based resin, a polyaramide based resin, a polyolefin based resin, a polycarbonate based resin, a polystyrene based resin, a polyacetal based resin, a fluorine based resin, or the like, can be presented. The thickness of the above-mentioned base material 44 is 5 μm to 100 μm, preferably about 10 μm to 50 μm.

Moreover, according to the present invention, for example, a desired printed pattern of characters, graphics, marks, patterns, designs, or the like can be deposited on the base material 34 by front surface printing or rear surface printing by an ordinary printing method. The characters, or the like can be recognized visibly via the barrier film 1 comprising the laminated material 41.

Figure 13:
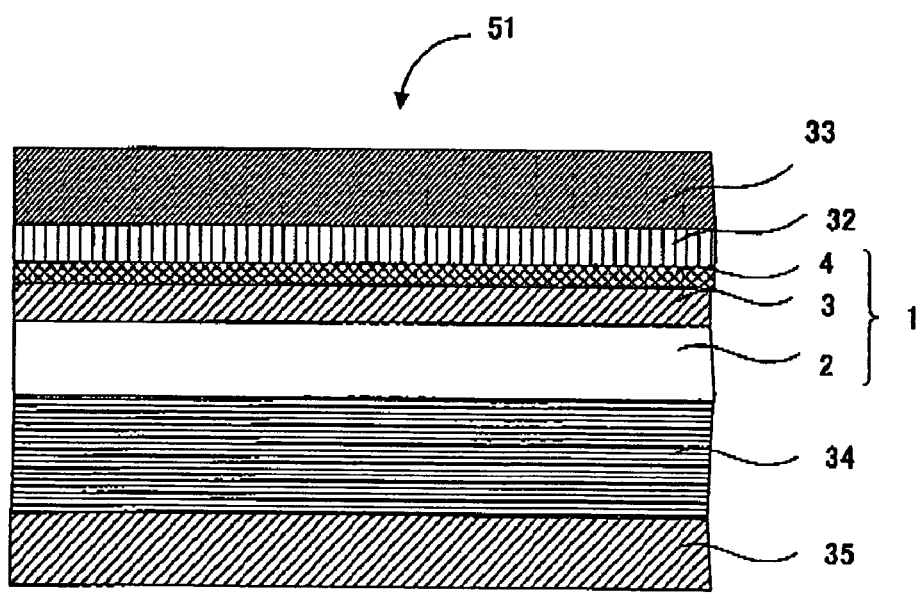
FIG. 13 is a schematic cross sectional view showing another example of a laminated material of the present invention.

FIG. 13 shows another example of the laminated material of the present invention using the above-mentioned barrier film 1. In FIG. 13, the laminated material 51 comprises a barrier film 1 having the barrier layer 3 and the resin layer 4 laminated in this order on one side surface of the base material film 2, a heat sealable resin layer 33 formed via the anchor coating agent layer and/or the adhesive layer 32 on the resin layer 4 of the barrier film 1, a base material 34 deposited on the other side surface (surface without the barrier layer 3 formation) of the base material film 2 of the barrier film 1, and a heat sealable resin layer 35 formed on the base material 34.

As the anchor coating agent layer, the adhesive layer and the heat sealable resin layer comprising the above-mentioned laminated material 51, the same anchor coating agent layer, adhesive layer and heat sealable resin layer comprising the above-mentioned laminated material 31 can be used, and moreover, the base material comprising the laminated material 51 can be same as the base material comprising the above-mentioned laminated material 41, and thus explanation is omitted here.

For the laminated material of the present invention, for example, a resin film or sheet having the barrier property with respect to the water vapor, water, or the like, of a low density polyethylene, a middle density polyethylene, a high density polyethylene, a straight chain like (linear) low density polyethylene, a polypropylene, an ethylene-propylene copolymer, of the like, a resin film or sheet having the barrier property with respect to the oxygen, water vapor, or the like, of a polyvinyl alcohol, and an ethylene-vinyl acetate copolymer saponified product, or the like, various kinds of colored resin films or sheets having the light blocking property produced by adding and kneading a coloring agent such as a pigment, and a desired additive to a resin, and forming a film, or the like, can be used.

These materials can be used by one kind or as a combination of two or more kinds. The thickness can be set optionally, and it is in general 5 to 300 μm, and preferably about 10 to 200 μm.

C. Packaging Container

Next, the packaging container of the present invention will be explained.

The packaging container of the present invention is produced by thermally fusing the heat sealable resin layer into a bag or a box, using the above-mentioned laminated material.

Specifically, in the case the packaging container is a soft packaging bag, by folding the heat sealable resin layer surface of the above-mentioned laminated material facing with each other, or superimposing two pieces of the above-mentioned laminated material, and thermally fusing the peripheral end parts by for example, side surface sealing, two side sealing, three side sealing, four side sealing, envelope attaching sealing, palm gathering attaching sealing, or another heat sealing form for forming the sealing part, the pack packaging container of the various forms of the present invention can be produced.

D. Image Display Medium

Next, the image display medium of the present invention will be explained.

The image display medium of the present invention is produced by using the above-mentioned barrier film.

According to the present invention, by using the barrier film having the high barrier property, a high quality image display medium capable of obtaining the preferable image display can be provided without suffering the influence of the oxygen, the water vapor, or the like after passage of the time.

As the image display medium of the present invention, a non light emitting type display for displaying by providing the gradation by shuttering the brightness of the back lighting such as a liquid crystal display, and a self light emitting type display for displaying by emitting a light beam from a fluorescent material by any energy such as a plasma display (PDP), a field emission display (FED), and an electroluminescent display (EL) can be presented. Among these examples, an image display medium with the easy generation of the light emitting defect by the influence of the moisture content or the gas is preferable, and the organic EL element is particularly preferable.

Moreover, the transparent substrate used for the image display medium may either be a glass substrate or a transparent resin substrate. From the viewpoint of the bulkiness of the image display medium, the light weight, and improvement of the shock resistance, the transparent resin substrate is preferable. Although the transparent resin substrate is light-weight, flexible and hardly crackable, it has the disadvantage of the low barrier property with respect to the glass substrate, However, according to the present invention, by using the above-mentioned barrier film having the high barrier property, the disadvantage can be solved, and a preferable image display can be obtained, As the image display medium of the present invention, among the above-mentioned examples, an organic EL element using the transparent resin substrate is preferable.

The present invention is not limited to the above-mentioned embodiments. The above-mentioned embodiments are examples, and any one having the substantially same configuration as the technological idea disclosed in the scope of the claims of the present invention and providing the same effects is included in the technological scope of the present invention.

EXAMPLES

Next, the present invention will be explained in further details with reference to the examples.

Example 1

As the base material film, a sheet like biaxial oriented polyester film (produced by Toyobo Co., Ltd., A4100, thickness 100 μm, size 21 cm×30 cm) was prepared, and it was mounted to the lower part electrode in the chamber of the plasma enhanced CVD device having the configuration shown in FIG. 8 with the surface not to be bonded disposed upward (side to have the film formation). Next, the pressure inside the chamber was reduced by an exhausting device comprising an oil rotary pump and a turbo molecular pump to the attained vacuum at $2.5 \times 10^{-4}$ Pa.

Moreover, as the material gas, an oxygen gas (produced by Taiyo Toyo Sanso Co., Ltd., purity 99.9999% or more) and a helium gas (produced by Taiyo Toyo Sanso Co., Ltd., purity 99.999% or more) were prepared. Furthermore, as the organic silicon compound material, a tetramethoxysilane (TMOS) (produced by Shin-Etsu Chemical Co., Ltd., KBM-04), and a hexamethyldisiloxane (HMDSO) (produced by Dow Corning Toray Silicone Co., Ltd., SH200, 0.65 cSt) were prepared.

Next, an electric power (input electric power 150 W) having a 90 kHz frequency was applied to the lower part electrode. Then, 12 sccm of an oxygen gas and 30 sccm of a helium gas were introduced from the gas inlet opening provided in the vicinity of the electrode into the chamber. At the same time, by introducing 4 sccm of a TMOS and controlling the opening degree of the exhausting valve provided between the exhausting device and the chamber, the pressure inside the chamber was maintained at 33 Pa so as to form a dense layer on the base material film (film deposition rate 25 nm/minute).

Furthermore, by increasing the electric power to be applied to the lower part electrode to 250 W, stopping the introduction of the TMOS and introducing 24 sccm of a HMDSO, a water repellent layer was formed on the above-mentioned dense layer so as to obtain a barrier film. The film deposition rate of the water repellent layer was 50 nm/minute. According to the plasma enhanced CVD device used, the electrode input tolerance electric power at the time of the film formation with the HMDSO used as the main material was 200 W. Here, "sccm" is the abbreviation of the "standard cubic centimeter per minute", and the same is applied hereinafter.

[Evaluation]

The ratio of atomic compositions, the thickness and the density of the dense layer, and the ratio of atomic compositions, component, thickness and the water repellent property (contact angle between water and the water repellent layer) in the barrier film of the example 1 were measured by the following conditions. Moreover, for the barrier film of the example 1, the overall optical transmittance, the oxygen transmission rate, and the water vapor transmission rate were measured by the following conditions. Furthermore, after preservation of the barrier film of the example 1 in an environment testing device (humidity controlled thermal oven) under the condition of 65° C. and the 90% relative humidity for 500 hours, the overall optical transmittance, the oxygen transmission rate and the water vapor transmission rate were measured by the same conditions. Results are shown in the following Table 1.

(Measurement of Atomic Compositions)

It was measured by the ESCA (produced by VG Scientific Corp., England, ESCA, LAB220i-XL) As the X ray source, a monochrome AlX beam source having a peak intensity of Ag-3d-5/2 from 300 Kcps to 1 Mcps, and a slit having about a 1 mm diameter were used. The measurement was carried out in a condition with the detector set on the normal of the specimen surface supplied for the measurement with an appropriate charge correction. The analysis after the measurement was carried out, using the software Eclipse version 2.1 provided to the above-mentioned ESCA device with the peak corresponding to the Si:2p, C:1s, O:1s binding energy. At the time, the Shalley's background elimination was executed to each peak, and the sensitivity coefficient correction of each element was executed for the peak area (Si=0.817 and O=2.930 with respect to C=1) so as to obtain the atomic percent. For the obtained atomic percent, the numbers of atoms of the other components, O and C were calculated with the number of Si atoms provided as 100 so as to obtain the ratio of atomic composition.

(Thickness Measurement)

The film thickness was measured by the observation of the base material cross section, using a scanning electron microscope (SEM: produced by Hitachi, L-cd., S-5000H). That is, for the sample preparation, first the cross section of the base material was provided using an ultra microtome (diamond knife). Furthermore, a conduction process was applied to the cross section by forming a platinum palladium alloy (Pt—Pd) film using a sputtering device (produced by Hitachi, Ltd., type E-1030, Hitachi ion sputtering device). At the time, the film formation was carried out with the conditions of the distance between the film formation target and the specimen of 30 mm, the discharge electric current of 15 mA, the film formation vacuum pressure of 10 Pa, and the sputtering time for film formation of 10 seconds.

With the sample accordingly produced set on the scanning electron microscope, the base material cross section was photographed by a 100,000 times magnification while observing that there is no drift (the drift amount of 1 mm or less in the 90 seconds) on the monitor screen with the acceleration voltage set at 1.2 kV, the emission electric current at 20 μA, the beam monitor diaphragm at 3 and the objective lens diaphragm at 3.

The film thickness was found out by measuring the length of the image in the screen central part of the photographed image, using the length measuring function provided to the scanning electron microscope. At the time, the length was measured in the direction with the film thickness direction of the member to be measured disposed by the 90 degree angle with respect to the image scanning direction. The measurement was carried out for 5 each of the samples, and the average value thereof was provided as the film thickness.

(Film Density Measurement)

It was measured as follows using an X ray reflectance measuring device (produced by Rigaku Corporation, ATX-E). That is, with a 18 kW X ray generating device used as the X ray source, and λ=1.5405 Å used as the CuKa wavelength by the Cu target, an objective surface artificial multi layer film mirror and a Ge (220) monochrome crystal were used for the monochrome meter. Moreover, as the setting conditions, the scanning speed was set at 0.1000°/minute, the sampling width at 0.0020, and the scanning range at 0 to 4.0000°. then, with the sample mounted by the magnet on the substrate holder, the 0° position adjustment was carried out by the automatic alignment function of the device. Thereafter, the x ray reflectance was measured by the above-mentioned measuring conditions. For the obtained reflectance measurement values, analysis was carried out with the 0.4 to 4.0° fitting area condition, using the above-mentioned analysis software (RGXR) provided to the X ray reflective index measuring device. At the time, the element ratio (Si:O:C=10:8:12) of the thin film was input as the fitting initial value. By fitting the reflective index by the non linear minimum least square method, the film, density was calculated.

(Water Repellent Property Measurement)

It was measured using CA-Z produced by Kyowa Interface Science, Co., Ltd. That is, by dropping a drop (a certain amount) of pure water onto the surface of the subject to be measured at the 23° C. measurement temperature, and observing the water drop shape using a microscope or a CCD camera after passage of a certain time (10 seconds), the contact angle was found out physically.

(Overall Optical Transmittance Measurement)

The overall optical transmittance was measured, using a overall optical transmittance measuring device (COLOUR S&M COMPUTER MODEL SM-C) produced by Suga Test Instruments, Co., Ltd.

(Oxygen Transmission Rate Measurement)

It was measured by the condition with the individual zero measurement of executing the background elimination measurement at the 23° C. measurement temperature and the 90% RH humidity, using an oxygen transmission rate measuring device (produced by MOCON, OX-TRAN 2/20: product name).

(Water Vapor Transmission Rate Measurement)

It was measured at 40° C. measurement temperature and the 100% RH humidity, using a water vapor transmission rate measuring device (produced by MOCON, PERMATRAN-W 3/31: product name).

Examples 2 to 12

Using the plasma enhanced CVD device same as in the example 1, the barrier films having the barrier layers shown in the below-mentioned Table 1 were produced with the film formation conditions adjusted.

The ration of atomic composition, the thickness and the density of the dense layer, and the ration of atomic composition, thickness, the water repellent property (contact angle between water and the water repellent layer) comprising the barrier layer in the barrier film of the examples 2 to 12 were measured by the same conditions as in the example 1. Moreover, the overall optical transmittance, the oxygen transmission rate, and the water vapor transmission rate of the barrier films of the examples 2 to 12 were measured by the same conditions as in the example 1. Results are shown in the below-mentioned Table 1.

Comparative Examples 1 to 9

Using the plasma enhanced CVD device same as in the example 1, the barrier films having the barrier layers shown in the below-mentioned Table 2 were produced with the film formation conditions adjusted.

The component, the thickness and the density of the dense layer, and the component, thickness and the water repellent property (contact angle between water and the water repellent layer) of the water repellent layer comprising the barrier layer in the barrier film of the comparative examples 1 to 9 were measured by the same conditions as in the example 1. Moreover, the overall optical transmittance, the oxygen transmission rate, and the water vapor transmission rate of the barrier films of the comparative examples 1 to 9 were measured by the same conditions as in the example 1. Results are shown in the below-mentioned Table 2.

Results (Examples 1 to 12, Comparative Examples 1 to 9)

The evaluation results of the examples 1 to 12 are shown in the Table 1, and the evaluation results of the comparative examples 1 to 9 are shown in the Table 2.

TABLE 1

| | Water repellent layer | | | Dense layer | | | Water repellent layer | | | Overall optical transmittance (%) | Water vapor transmission rate (g/m²/day) | | Oxygen transmission rate (cc/m²/day · atm) | |
|---|---|---|---|---|---|---|---|---|---|---|---|---|---|---|
| | Si:O:C (Atomic percent) | Thickness (nm) | Contact angle (°) | Si:O:C (Atomic percent) | Thickness (nm) | Density (g/cm³) | Si:O:C (Atomic percent) | Thickness (nm) | Contact angle (°) | | Before 500 hr storage | After 500 hr storage | Before 500 hr storage | After 500 hr storage |
| Example 1 | — | — | — | 10:184:35 | 80 | 2.9 | 100:81:141 | 20 | 109 | 92 | 0.33 | 0.35 | 0.32 | 0.31 |
| Example 2 | — | — | — | 100:187:36 | 78 | 2.9 | 100:42:156 | 19 | 118 | 86 | 0.26 | 0.22 | 0.21 | 0.19 |
| Example 3 | — | — | — | 100:185:35 | 83 | 2.9 | 100:115:85 | 21 | 65 | 90 | 0.43 | 0.46 | 0.45 | 0.48 |
| Example 4 | — | — | — | 100:182:38 | 81 | 2.9 | 100:82:138 | 290 | 115 | 86 | 0.15 | 0.14 | 0.13 | 0.18 |
| Example 5 | 10:72:151 | 10 | 105 | 100:186:35 | 84 | 2.9 | 100:80:135 | 11 | 108 | 92 | 0.15 | 0.13 | 0.12 | 0.12 |
| Example 6 | — | — | — | 100:140:25 | 80 | 2.6 | 100:81:142 | 19 | 112 | 91 | 0.40 | 0.42 | 0.36 | 0.38 |
| Example 7 | — | — | — | 100:198:7 | 79 | 3.0 | 100:78:145 | 22 | 110 | 90 | 0.15 | 0.13 | 0.18 | 0.17 |
| Example 8 | — | — | — | 100:181:5 | 78 | 2.7 | 100:80:141 | 23 | 108 | 90 | 0.37 | 0.39 | 0.22 | 0.20 |
| Example 9 | — | — | — | 100:145:60 | 80 | 2.3 | 100:75:140 | 19 | 108 | 89 | 0.11 | 0.16 | 0.19 | 0.25 |
| Example 10 | — | — | — | 100:188:36 | 5 | 2.9 | 100:78:138 | 20 | 110 | 93 | 0.45 | 0.48 | 0.44 | 0.45 |
| Example 11 | — | — | — | 100:184:34 | 290 | 2.9 | 100:79:143 | 19 | 111 | 86 | 0.09 | 0.11 | 0.25 | 0.27 |
| Example 12 | — | — | — | 100:142:15 | 79 | 2.0 | 100:82:140 | 20 | 110 | 88 | 0.46 | 0.49 | 0.20 | 0.25 |

TABLE 2

| | Water repellent layer | | | Dense layer | | | Water repellent layer | | | Overall optical transmittance (%) | Water vapor transmission rate (g/m²/day) | | Oxygen transmission rate (cc/m²/day·atm) | |
|---|---|---|---|---|---|---|---|---|---|---|---|---|---|---|
| | Si:O:C (Atomic percent) | Thickness (nm) | Contact angle (°) | Si:O:C (Atomic percent) | Thickness (nm) | Density (g/cm³) | Si:O:C (Atomic percent) | Thickness (nm) | Contact angle (°) | | Before 500 hr storage | After 500 hr storage | Before 500 hr storage | After 500 hr storage |
| Comparative example 1 | — | — | — | 100:185:37 | 100 | 2.9 | — | — | — | 94 | 0.48 | 0.92 | 0.50 | 0.81 |
| Comparative example 2 | — | — | — | 100:182:38 | 98 | 2.9 | 100:141:72 | 20 | 80 | 91 | 0.40 | 0.75 | 0.44 | 0.64 |
| Comparative example 3 | — | — | — | 100:185:35 | 103 | 2.9 | 100:20:178 | 21 | 125 | 82 | 0.22 | 0.21 | 0.23 | 0.20 |
| Comparative example 4 | — | — | — | 100:188:33 | 101 | 2.9 | 100:82:143 | 308 | 118 | 84 | 0.05 | 0.04 | 0.08 | 0.09 |
| Comparative example 5 | 100:135:75 | 10 | 83 | 100:189:35 | 100 | 2.9 | 100:144:72 | 10 | 80 | 90 | 0.41 | 0.65 | 0.42 | 0.83 |
| Comparative example 6 | — | — | — | 100:220:10 | 78 | 2.9 | 100:79:142 | 20 | 110 | 90 | 0.51 | 0.63 | 0.56 | 0.60 |
| Comparative example 7 | — | — | — | 100:187:0 | 80 | 2.5 | 100:80:140 | 20 | 107 | 89 | 0.82 | 0.94 | 0.43 | 0.53 |
| Comparative example 8 | — | — | — | 100:185:35 | 2 | 2.9 | 100:83:145 | 22 | 106 | 92 | 0.60 | 1.21 | 0.58 | 0.77 |
| Comparative example 9 | — | — | — | 100:188:34 | 330 | 2.9 | 100:78:137 | 22 | 107 | 87 | 0.32 | 0.45 | 0.41 | 1.73 |

As shown in the Table 1, the barrier films of the examples 1 to 12 have a 85% or more overall optical transmittance, a 0.5 cc/m²/day·atm or less oxygen transmission rate, and a 0.5 g/m²/day or less water vapor transmission rate so that it was confirmed that they have a high barrier property. In contrast, as shown in the Table 2, the barrier films of the comparative examples 1 to 9 are insufficient in terms of any of the overall optical transmittance, the oxygen transmission rate and the water vapor transmission rate compared with the examples.

Example 13

As the base material film, a roll like biaxial oriented polyester film (produced by Unitika, Ltd., EMBLET, thickness 12 μm, width 2,000 mm) was prepared, and it was mounted in the chamber of the plasma enhanced CVD device having three continuous film formation zones (the first film formation zone to the third film formation zone) of the configuration shown in FIG. 9 with the surface without the corona process disposed upward (side to have the film formation). Then, the pressure inside the chamber was reduced by an exhausting device comprising an oil rotary pump and a turbo molecular pump to the attained vacuum at $2.5 \times 10^{-4}$ Pa.

Moreover, as the material gas, an oxygen gas (produced by Taiyo Toyo Sanso Co., Ltd., purity 99.9999% or more), a helium gas (produced by Taiyo Toyo Sanso Co., Ltd., purity 99.999% or more), and an argon gas (produced by Taiyo Toyo Sanso Co., Ltd., purity 99.999% or more) were prepared. Furthermore, as the organic silicon compound material, a tetramethoxysilane (TMOS) (produced by Shin-Etsu Chemical Co., Ltd., KBM-04), and a hexamethyldisiloxane (HMDSO) (produced by Dow Corning Toray Silicone Co., Ltd., SH200, 0.65 cSt) were prepared.

In the first film formation zone, an electric power (input electric power 10 kW (the limit value of the input tolerance electric power)) having a 40 kHz frequency was applied to the lower part electrode and the coating drum (upper part electrode). Then, 0.2 slm of a HMDSO, 0.2 slm of a helium gas and 0.4 slm of an argon gas were introduced from the gas inlet opening into the first film formation zone (the oxygen gas was not introduced).

Moreover, in the second film formation zone, an electric power (input electric power 10 kW (the limit value of the input tolerance electric power)) having a 40 kHz frequency was applied to the lower part electrode and the coating drum (upper part electrode). Then, 1 slm of a TMOS, 0.2 slm of an oxygen gas, 0.2 slm of a helium gas and 0.4 slm of an argon gas were introduced from the gas inlet opening into the second film formation zone.

Furthermore, in the third film formation zone, an electric power (input electric power 13 kW (the electrode input tolerance electric power in the third film formation zone at the time of forming a film on the same member to have the film formation, using a HMDSO in the all film formation zones form the first film formation zone to the third film formation zone is 10 kW) having a 40 kHz frequency was applied to the lower part electrode and the coating drum (upper part electrode). Then, 0.2 slm of a HMDSO, 0.2 slm of a helium gas and 0.4 slm of an argon gas were introduced from the gas inlet opening into the third film formation zone (the oxygen gas was not introduced).

Then, by controlling the opening degree of the exhausting valve provided between the exhausting device and the chamber, the film formation pressure from the first film formation zone to the third film formation zone was maintained at 2.5 Pa so as to form a water repellent layer on the base material film in the first film formation zone, a dense layer on the above-mentioned water repellent layer in the second film formation zone, and a water repellent layer on the above-mentioned dense layer in the third film formation zone for forming a barrier layer while conveying the base material film by a 20 m/min speed so as to obtain a barrier film.

The component, the thickness and the water repellent property of the water repellent layer comprising the barrier layer formed as mentioned above were measured by the same conditions as in the example 1. As a result, the atomic percent Si:O:C was 100:60:150 in the both water repellent layers, the thickness was 10 nm, and the water repellent property was 110°. Moreover, the component, the thickness and the density of the dense layer comprising the barrier layer were measured by the same conditions as in the example 1. As a result, the atomic percent Si:O:C was 100:185:35, the thickness was 10 nm and the density was 2.9 g/cm$^3$.

Furthermore, for the barrier film produced as mentioned above, the overall optical transmittance, the oxygen transmission rate, and the water vapor transmission rate were measured in the same conditions as in the example 1. As a result, the overall optical transmittance was 90%, which shows a high transparency. Moreover, both before and after the storage of 500 hours, the oxygen transmission rate was 0.5 cc/m$^2$/day·atm or less, and the water vapor transmission rate was 0.5 g/m$^2$/day or less, and thus it was confirmed that it has a high barrier property.

Comparative Example 10

A barrier film was obtained with the same plasma enhanced CVD device as in the example 13, using only the second film formation zone such that the base material film running speed was changed to 5 m/minute and only the dense layer is formed to have the 30 nm film thickness.

The component, the thickness and the density of the dense layer comprising the barrier layer formed as mentioned above were measured by the same conditions as in the example 1. As a result, the atomic percent Si:O:C was 100:185:35, the thickness was 30 nm and the density was 2.9 g/cm$^3$.

Furthermore, for the barrier film, the overall optical transmittance, the oxygen transmission rate, and the water vapor transmission rate were measured in the same conditions as in the example 1. As a result, the overall optical transmittance was 92%, which shows a high transparency.

On the other hand, as to the barrier property, although the oxygen transmission rate was 0.5 cc/m$^2$/day·atm or less both before and after the storage of 500 hours, the water vapor transmission rate was more than 0.5 g/m$^2$/day, and thus it has a barrier property worse than that of the barrier film of the example 13.

Examples 14 to 21

As the base material film, a sheet like biaxial oriented polyester film (produced by Unitika, Ltd., EMBLET, size 10 cm×10 cm, thickness 12 μm) was prepared, and it was mounted to the lower part electrode in the chamber of the plasma enhanced CVD device having the configuration shown in FIG. 8 with the surface not to have the corona process disposed upward (side to have the film formation). The pressure inside the chamber was reduced by an exhausting device comprising an oil rotary pump and a turbo molecular pump to the attained vacuum at 2.5×10$^{-4}$ Pa.

Moreover, as the material gas, an oxygen gas (produced by Taiyo Toyo Sanso Co., Ltd., purity 99.9999% or more), a helium gas (produced by Taiyo Toyo Sanso Co., Ltd., purity 99.9999% or more), and an argon gas (produced by Taiyo Toyo Sanso Co., Ltd., purity 99.9999% or more) were prepared. Furthermore, as the organic silicon compound material, a tetramethoxysilane (TMOS) (produced by Shin-Etsu Chemical, Co., Ltd., KBM-04), and a hexamethyldisiloxane (HMDSO) (produced by Dow Corning Toray Silicone Co., Ltd., SH200, 0.65 cSt) were prepared.

Next, an electric power (input electric power 500 W) having a 90 kHz frequency was applied to the lower part electrode. Then, 30 sccm of an oxygen gas, 10 sccm of a helium gas and 30 sccm of an argon gas were introduced from the gas inlet opening provided in the vicinity of the electrode into the chamber. At the same time, by introducing a HMDSO and a TMOS by the composition ratio shown in the below-mentioned Table 3, and controlling the opening degree of the exhausting valve provided between the exhausting device and the chamber, the pressure inside the chamber was maintained at 33 Pa so as to form a barrier layer on the base material film.

The barrier film produced as mentioned above was measured by the same conditions as in the example 1. Results are shown in the below-mentioned Table 3.

Comparative Examples 11, 12

In the same manner as in the examples 14 to 21 except that a HMDSO and a TMOS were introduced by the composition ratio shown in the below-mentioned Table 3, barrier films were produced.

The barrier films produced as mentioned above were measured by the same conditions as in the example 1. Results are shown in the below-mentioned Table 3.

Example 22

As the base material film, a roll like biaxial oriented polyester film (produced by Unitika, Ltd., EMBLET, thickness 12 μm) was prepared, and it was mounted in the chamber of the plasma enhanced CVD device of the configuration shown in FIG. 10 with the surface without the corona process disposed to the outside of the coating drum (side to have the film formation). Then, the pressure inside the chamber and the film formation zone was reduced by an exhausting device comprising an oil rotary pump and a turbo molecular pump to the attained vacuum at $2.5 \times 10^{-4}$ Pa.

Moreover, as the material gas, an oxygen gas (produced by Taiyo Toyo Sanso Co., Ltd., purity 99.9999% or more), a helium gas (produced by Taiyo Toyo Sanso Co., Ltd., purity 99.9999% or more), and an argon gas (produced by Taiyo Toyo Sanso Co., Ltd., purity 99.9999% or more) were prepared. Furthermore, as the organic silicon compound material, a tetramethoxysilane (TMOS) (produced by Shin-Etsu Chemical Co., Ltd., KBM-04), and a hexamethyldisiloxane (HMDSO) (produced by Dow Corning Toray Silicone Co., Ltd., SH200, 0.65 cSt) were prepared.

Next, an electric power (input electric power 3 kW (the limit value of the input tolerance electric power)) having a 50 kHz frequency was applied to the lower part electrode and the coating drum (upper part electrode) in the film formation zone. Then, 600 sccm of an oxygen gas, 600 sccm of a helium gas and 150 sccm of an argon gas were introduced from the gas inlet opening into the zone. At the same time, by introducing 1,000 sccm of a HMDSO and a TMOS vaporized by a 500 sccm monomer flow rate, and controlling the opening degree of the exhausting valve provided between the exhausting device and the chamber, the pressure inside the chamber was maintained at 4 Pa so as to form a barrier layer on the base material film in the film formation zone while conveying the base material film by a 12 m/min speed so as to obtain a barrier film.

The components of the water repellent layer and the dense layer comprising the barrier layer formed as mentioned above were measured by the same conditions as in the example 1. As a result, the atomic percent Si:O:C in the water repellent layer was 100:108:10, and the atomic percent in the dense layer was Si:O:C=100:145:52.

Moreover, the oxygen transmission rate and the water vapor transmission rate of the barrier film produced as mentioned above were measured by the same conditions as in the example 1. At the time, measurement was carried out at 10 points in a 500 mm range in the width direction of the barrier film. As a result, the oxygen transmission rate was 2.5 cc/m²/day·atm or less, and the water vapor transmission rate was 2.5 g/m²/day or less at the all 10 points, which shows a high barrier property.

Example 23

In the same film formation method as in the example 22, the barrier layer was formed by two layers continuously so as to obtain a barrier film.

The components of the water repellent layer and the dense layer comprising the barrier layer formed as mentioned above were measured by the same conditions as in the example 1. As a result, the atomic percent Si:O:C in the water repellent layer was 100:108:105, and the atomic percent in the dense layer was Si:O:C=100:145:52.

Moreover, the oxygen transmission rate and the water vapor transmission rate of the barrier film produced as mentioned above were measured by the same conditions as in the example 1. At the time, measurement was carried out at 10 points in a 500 mm range in the width direction of the barrier film. As a result, the oxygen transmission rate was 2.5 cc/m²/day·atm or less, and the water vapor transmission rate was 2.5 g/m²/day or less at the all 10 points, which shows a high barrier property.

Example 24

In the same film formation method as in the example 22, the barrier layer was formed by three layers continuously on the base film while conveying the base material film at a 150 m/min speed, using a plasma enhanced CVD device having three continuous film formation zones of the configuration shown in FIG. 9 so as to obtain a barrier film.

The oxygen transmission rate and the water vapor transmission rate of the barrier film produced as mentioned above were measured by the same conditions as in the example 1. At the time, measurement was carried out at 10 points in a 500 mm range in the width direction of the barrier film. As a result, the oxygen transmission rate was 2.5 cc/m²/day·atm or less, and the water vapor transmission rate was 2.5 g/m²/day or less at the all 10 points, which shows a high barrier property.

Comparative Examples 13 to 15

By preparing a hexamethyldisiloxane (HMDSO) (produced by Dow Corning Toray Silicone Co., Ltd., SH200, 0.65 cSt), and a tetramethoxysilane (TMOS) (produced by Shin-Etsu Chemical Co., Ltd., KBM-04) as the organic silicon compound, and introducing the same by the composition ratio shown in the below-mentioned Table 4, a barrier film was obtained by the same film formation method as in the examples 14 to 21.

The components of the water repellent layer and the dense layer comprising the barrier layer formed as mentioned above were measured by the same conditions as in the example 1. Results are shown in the below-mentioned Table 4.

Comparative Example 16

By preparing a hexamethyldisiloxane (HMDSO) (produced by Dow Corning Toray Silicone Co., Ltd., SH200, 0.65 cSt) as the organic silicon compound, a barrier film was obtained by forming the barrier layer by one layer on the base material film by the same film formation method as in the example 22.

The oxygen transmission rate and the water vapor transmission rate of the barrier film produced as mentioned above were measured by the same conditions as in the example 1. At the time, measurement was carried out at 10 points in a 500 mm range in the width direction of the barrier film. As a result, the oxygen transmission rate was each 5, 20, 10, 8, 18, 2, 10, 8, 6, 10 cc/m²/day·atm, and the water vapor transmission rate was each 5, 10, 15, 8, 3, 5, 20, 10, 15, 10 g/m²/day, which shows a poor barrier property.

Results (Examples 14 to 21, Comparative Examples 11 to 15)

Figure 14:
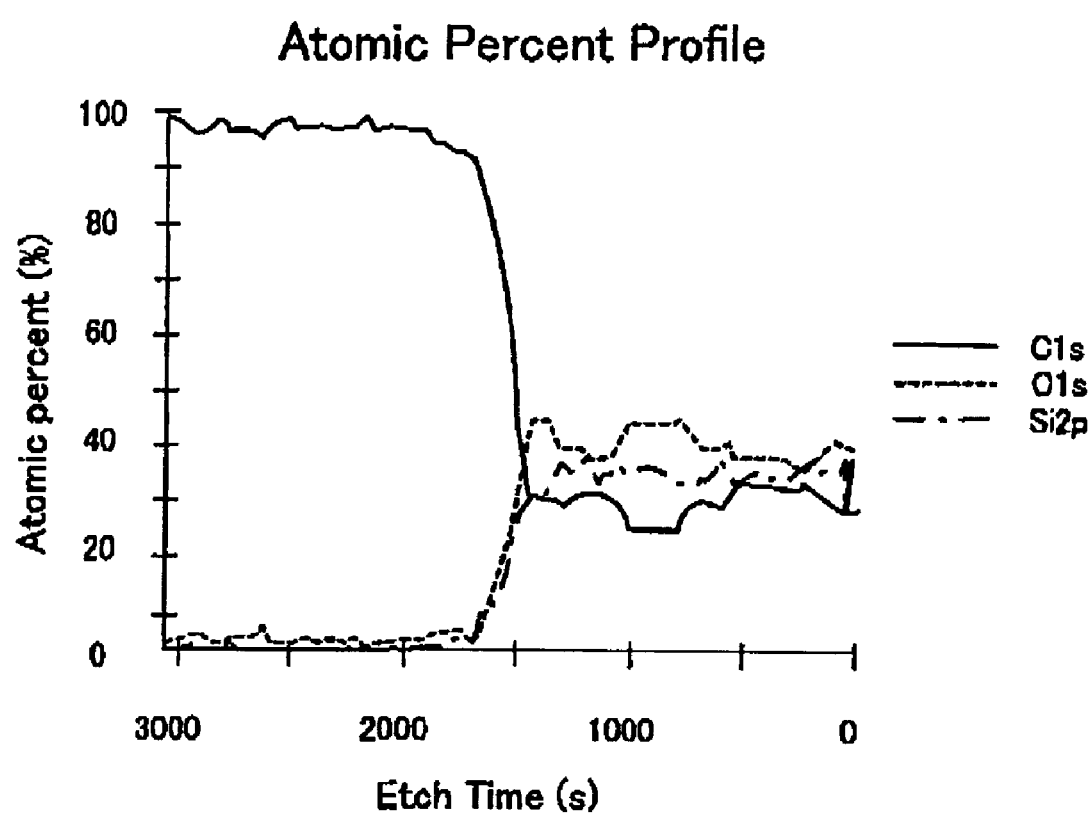
FIG. 14 is a graph showing the profile of the atomic percent of Si, O and C in the thickness direction in the example 15.
Figure 15:
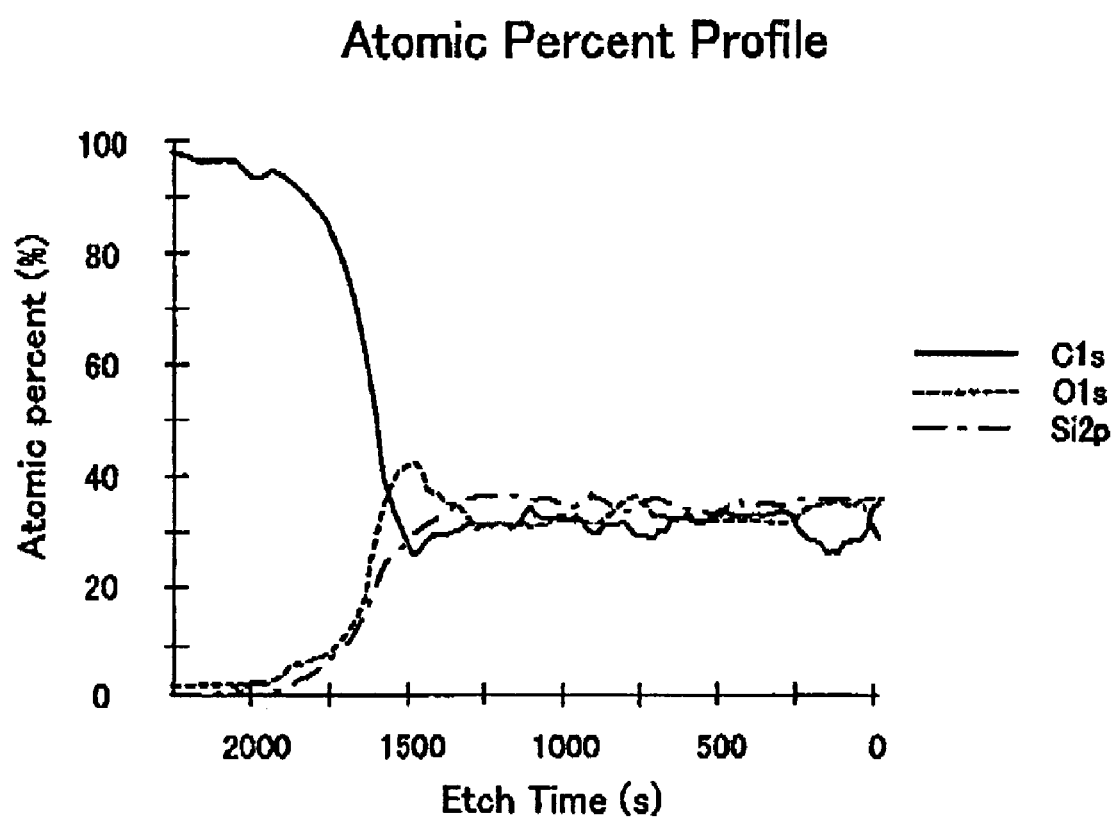
FIG. 15 is a graph showing the profile of the atomic percent of Si, O and C in the thickness direction in the comparative example 13.

The evaluation results of the examples 14 to 21, and the comparative examples 11, 12 are shown in the Table 3, and the evaluation results of the comparative examples 13 to 15 are shown in the Table 4. Moreover, FIG. 14 is a graph showing the profile of the atomic percent in the thickness direction in the example 15 obtained by the method disclosed in the above-mentioned "component measurement". Moreover, FIG. 15 is a similar graph in the comparative example 13.

TABLE 3

| | Water repllent layer | | | Dense layer | | | | | | |
|---|---|---|---|---|---|---|---|---|---|---|
| | | | | Measurement | | | | | | |
| | HMDSO: | | Measurement position (distance from the outermost surface with | | position (distance from the central part from the film thickness center with the premise | Thickness | Water vapor transmission rate (g/m$^2$/day) | | Oxygen transmission rate (cc/ m$^2$/day · atm) | |
| | TMOS (mole ratio) | Si:O:C (Atomic percent) | the premise that the film thickness is defined to be 100) | Si:O:C (Atomic percent) | that the entire film thickness is defined to be 100) | of Barrier layer (nm) | Before 500 hr storage | After 500 hr storage | Before 500 hr storage | After 500 hr storage |
| Example 14 | 1:0.45 | 100:107:102 | 6 | 100:148:60 | 5 | 50 | 2.5 | 2.5 | 2.5 | 2.4 |
| Example 15 | 1:0.51 | 100:108:110 | 8 | 100:148:95 | 3 | 25 | 1.8 | 1.8 | 2.2 | 2.2 |
| Example 16 | 1:0.53 | 100:107:103 | 5 | 100:148:60 | 2 | 27 | 2.0 | 1.9 | 2.1 | 2.1 |
| Example 17 | 1:0.45 | 100:108:107 | 7 | 100:140:70 | 4 | 25 | 1.8 | 1.8 | 2.2 | 2.2 |
| Example 18 | 1:0.52 | 100:108:105 | 8 | 100:135:50 | 6 | 28 | 2.0 | 2.0 | 2.2 | 2.2 |
| Example 19 | 1:0.48 | 100:108:105 | 5 | 100:135:51 | 7 | 25 | 2.2 | 2.2 | 2.6 | 2.5 |
| Example 20 | 1:0.75 | 100:110:82 | 6 | 100:160:55 | 1 | 28 | 2.7 | 2.7 | 1.5 | 1.6 |
| Example 21 | 1:0.30 | 100:105:125 | 6 | 100:135:83 | 2 | 25 | 1.3 | 1.4 | 2.5 | 2.5 |
| Example 11 | 1:0.8 | 100:125:75 | 6 | 100:170:53 | 2 | 27 | 3.5 | 5.8 | 1.4 | 2.1 |
| Example 12 | 1:0.25 | 100:103:135 | 6 | 100:127:103 | 1 | 30 | 1.1 | 1.7 | 2.6 | 3.4 |

TABLE 4

| | HMDSO:TMOS (mole ratio) | Si:O:C (Atomic percent) | Measurement position (distance from the outermost surface with the premise that the film thickness is defined to be 100) | Measurement position (distance from the central part from the film thickness center with the premise that the entire film thickness is defined to be 100) | Water vapor transmission rate (g/m$^2$/day) | Oxygen transmission rate (cc/m$^2$/ day · atm) |
|---|---|---|---|---|---|---|
| Comparative example 13 | 1:0 | 100:107:102 | 6 | — | | |
| Comparative example 14 | 0:1 | 100:150:60 | — | 6 | 3.2 | 2.6 |
| Comparative example 15 | 0:2 | 100:150:60 | — | 6 | 5.2 | 5.2 |

Examples 25 to 28

Using the plasma enhanced CVD device same as in the example 1, the barrier films having the barrier layers shown in the below-mentioned Table 5 were produced with the film formation conditions adjusted.

The component, the thickness, the density of the dense layer, the component, thickness, the water repellent property of the water repellent layer, the oxygen transmission rate, and the water vapor transmission rate of the barrier films produced as mentioned above were measured by the same conditions as in the example 1. Results are shown in the below-mentioned Table 5.

Examples 29, 30

Using the plasma enhanced CVD device same as in the example 13, the barrier films having the barrier layers shown in the below-mentioned Table 5 were produced with the film formation conditions adjusted.

The component, the thickness, the density of the dense layer, the component, thickness, the water repellent property of the water repellent layer, the oxygen transmission rate, and the water vapor transmission rate of the barrier films produced as mentioned above were measured by the same conditions as in the example 1. Results are shown in the below-mentioned Table 5.

Comparative Examples 17 to 19

Using the plasma enhanced CVD device same as in the example 1, the barrier films having the barrier layers shown in the below-mentioned Table 5 were produced with the film formation conditions adjusted.

The component, the thickness, the density of the dense layer, the component, thickness, the water repellent property of the water repellent layer, the oxygen transmission rate, and the water vapor transmission rate of the barrier films produced as mentioned above were measured by the same conditions as in the example 1. Results are shown in the below-mentioned Table 5.

Comparative Examples 20 to 22

Using the plasma enhanced CVD device same as in the example 13, the barrier films having the barrier layers shown in the below-mentioned Table 5 were produced with the film formation conditions adjusted.

The component, the thickness, the density of the dense layer, the component, thickness, the water repellent property of the water repellent layer, the oxygen transmission rate, and the water vapor transmission rate of the barrier films produced as mentioned above were measured by the same conditions as in the example 1. Results are shown in the below-mentioned Table 5.

TABLE 5

| | Dense layer | | | Water repellent layer | | | Dense layer | | | Water vapor transmission rate (g/m²/day) | | Oxygen transmission rate (cc/ m²/day · atm) | |
|---|---|---|---|---|---|---|---|---|---|---|---|---|---|
| | Si:O:C (Atomic percent) | Thickness (nm) | Density (g/cm³) | Si:O:C (Atomic percent) | Thickness (nm) | Contact angle (°) | Si:O:C (Atomic percent) | Thickness (nm) | Density (g/cm³) | Before 500 hr storage | After 500 hr storage | Before 500 hr storage | After 500 hr storage |
| Example 25 | — | — | — | 100:80:135 | 21 | 110 | 100:175:50 | 75 | 2.8 | 0.28 | 0.29 | 0.31 | 0.29 |
| Example 26 | — | — | — | 100:71:155 | 19 | 104 | 100:124:70 | 77 | 2.4 | 0.36 | 0.35 | 0.41 | 0.42 |
| Example 27 | 100:150:70 | 18 | 2.6 | 100:60:158 | 42 | 107 | 100:155:80 | 20 | 2.6 | 0.25 | 0.23 | 0.47 | 0.40 |
| Example 28 | 100:185:36 | 37 | 2.9 | 100:82:142 | 20 | 106 | 100:182:40 | 43 | 2.9 | 0.36 | 0.35 | 0.38 | 0.40 |
| Example 29 | — | — | — | 100:95:107 | 12 | 103 | 100:120:85 | 12 | 2.7 | 0.45 | 0.46 | 0.47 | 0.43 |
| Example 30 | 100:132:98 | 10 | 2.7 | 100:93:107 | 10 | 105 | 100:117:83 | 10 | 2.7 | 0.37 | 0.38 | 0.40 | 0.41 |
| Comparative example 17 | — | — | — | 100:118:72 | 20 | 75 | 100:174:45 | 80 | 2.8 | 0.53 | 0.74 | 0.55 | 1.13 |
| Comparative example 18 | — | — | — | 100:85:145 | 23 | 105 | 100:95:120 | 75 | 1.9 | 0.38 | 0.85 | 1.72 | 2.30 |
| Comparative example 19 | — | — | — | 100:81:135 | 103 | 118 | — | — | — | 0.31 | 0.52 | 4.3 | 7.7 |
| Comparative example 20 | — | — | — | 100:92:75 | 15 | 92 | 100:88:115 | 14 | 1.9 | 0.49 | 0.73 | 0.81 | 1.52 |
| Comparative example 21 | — | — | — | 100:105:103 | 17 | 98 | 100:107:101 | 12 | 2.3 | 0.56 | 0.82 | 0.84 | 2.5 |
| Comparative example 22 | — | — | — | 100:120:75 | 15 | 70 | 100:125:73 | 15 | 75 | 0.55 | 0.85 | 0.33 | 0.35 |

Examples 31 to 33

Figure 16:
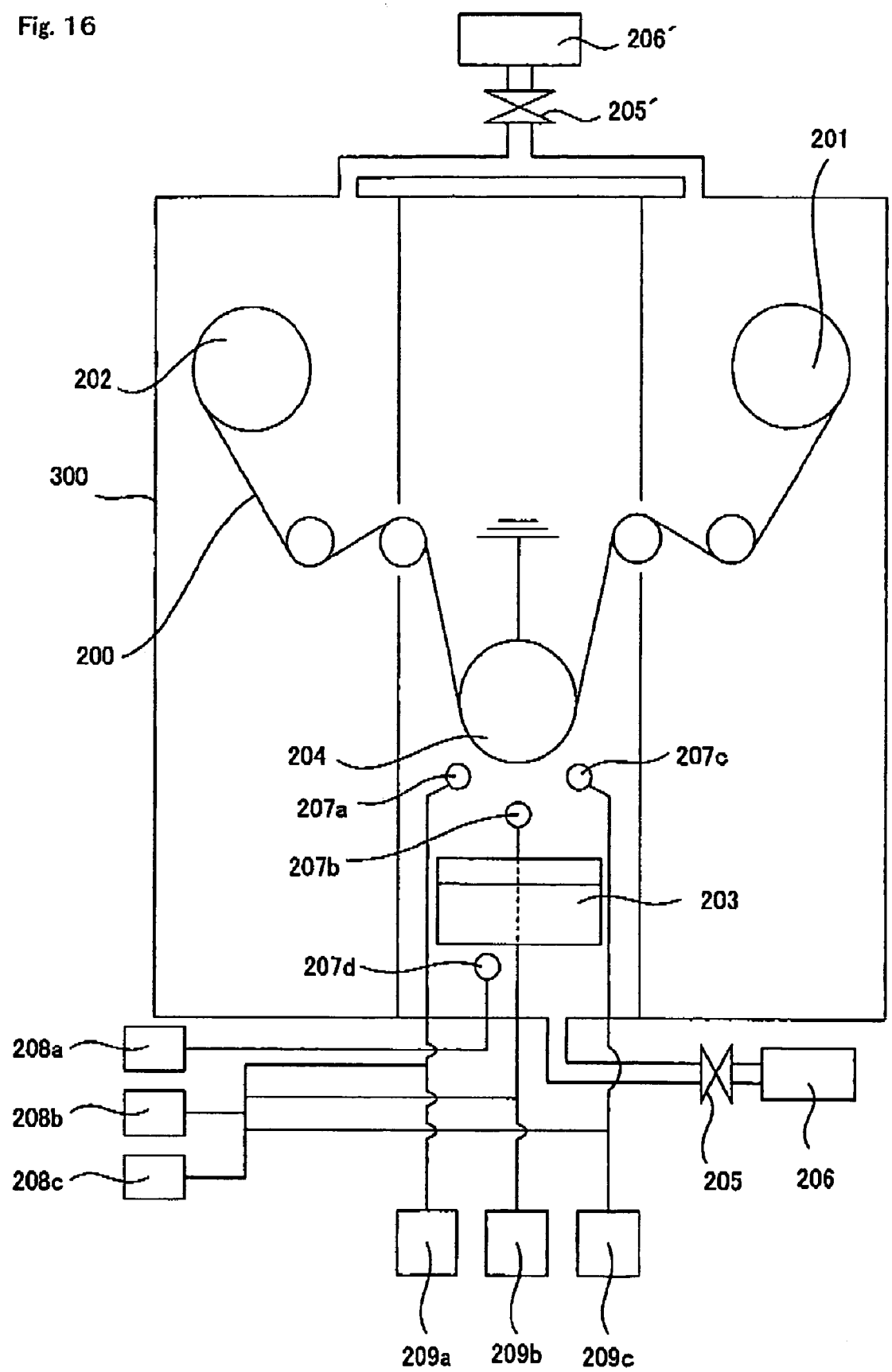
FIG. 16 is a schematic diagram showing another example of a plasma CVD coating device used in the present invention.

As the base material film, a sheet like biaxial oriented polyester film (produced by Unitika, Ltd., EMBLET, thickness 12 μm, width 700 mm) was prepared, and it was mounted in the chamber 300 of the plasma enhanced CVD device having a film formation zone and four gas inlet openings 207a, 207b, 207c, 207d of the configuration shown in FIG. 16 with the surface to be bonded easily disposed to the outer side of the coating drum (side to have the film formation). Then, the pressure inside the chamber 300 and the film formation zone was reduced by exhausting devices 206, 206' comprising an oil rotary pump and a mechanical booster pump to the attained vacuum at 2.5×10⁻³ Pa.

Moreover, as the material gas, an oxygen gas (produced by Taiyo Toyo Sanso Co., Ltd., purity 99.9999% or more), a helium gas (produced by (Taiyo Toyo Sanso Co., Ltd., purity 99.9999% or more), and an argon gas (produced by Taiyo Toyo Sanso Co., Ltd., purity 99.9999% or more) were prepared. Furthermore, as the organic silicon compound material, a tetramethoxysilane (TMOS) (produced by Shin-Etsu Chemical Co., Ltd., KBM-04), and a hexamethyldisiloxane (HMDSO) (produced by Dow Corning Toray Silicone Co., Ltd., SH200, 0.65 cSt) were prepared.

Next, an electric power (3 kW) having a 40 kHz frequency was applied between the lower part electrode 203 and the coating drum (upper part electrode) 204 in the film formation zone. Then, the material gas was introduced from the gas inlet openings 207a, 207b, 207c, 207d into the film formation zone as mentioned below.

Gas inlet opening 207a: 300 sccm of an oxygen gas, 200 scam of a helium gas, and 500 sccm of a TMOS were vaporized and introduced.

Gas inlet opening 207b: 200 sccm of a helium gas, and 1,000 scam of a HMDSO were vaporized and introduced.

Gas inlet opening 207c: 300 sccm of an oxygen gas, 200 scam of a helium gas, and 500 sccm of a TMOS were vaporized and introduced.

Gas inlet opening 207d: 150 scam of an argon gas was vaporized and introduced.

Furthermore, by controlling the opening degree of the exhausting valve 205 provided between the exhausting device 206 and the film formation zone so as to maintain the pressure inside the film formation zone at 4 Pa, a barrier layer was formed on the base material film 200 in the film formation zone while conveying the base material film 200 at a 100 m/min speed so as to obtain a barrier film.

The component, the thickness, the density of the dense layer, the component, thickness, the water repellent property of the water repellent layer, the oxygen transmission rate, and the water vapor transmission rate of the barrier films produced as mentioned above were measured by the same conditions as in the example 1. Results are shown in the below-mentioned Table 6.

Comparative Examples 23, 24

By preparing a hexamethyldisiloxane (HMDSO) (produced by Dow Corning Toray Silicone Co., Ltd., SH200, 0.65 cSt), and a tetramethoxysilane (TMOS) (produced by Shin-Etsu Chemical Co., Ltd., KBM-04) as the organic silicon compound, and introducing the same by the composition ratio shown in the below-mentioned Table 6, a barrier film was obtained by the same film formation method as in the examples 31 to 33.

The component, the thickness, the density of the dense layer, the component, thickness, the water repellent property of the water repellent layer, the oxygen transmission rate, and the water vapor transmission rate of the barrier films produced as mentioned above were measured by the same conditions as in the example 1. Results are shown in the below-mentioned Table 6.

Results (Examples 31 to 33, Comparative Examples 23, 24)

The evaluation results of the examples 31 to 33 and the comparative examples 23, 24 are shown in the Table 6.

What is claimed is:

1. A barrier film comprising a base material film and a barrier layer deposited on at least one side surface of the base material film,
    wherein the barrier layer comprises a water repellent layer and a dense layer,
    the water repellent layer is a silicon oxide carbide film having the atomic percent of Si:O:C in a range of 100:40 to 120:80 to 160, and the thickness in a range of 2 to 300 nm,
    the dense layer is a silicon oxide carbide film having the atomic percent of Si:O:C in a range of 100:100 to 200:5 to 100, and the thickness in a range of 5 to 300 nm,
    the base material film is a resin film having the thickness in a range of 5 μm to 500 μm, and
    the barrier layer has a laminated structure comprising the dense layer sandwiched between two water repellent layers.

2. The barrier film according to claim 1, wherein the barrier layer is a silicon oxide carbide film with the atomic percent of O (oxygen) with respect to Si (silicon) reduced continuously from the central part in the thickness direction toward the both outer sides and the atomic percent of C (carbon) with respect to Si (silicon) increased from the central part toward the both outer sides in the thickness direction.

3. The barrier film according to claim 1, wherein the barrier layer is laminated by two or more layers.

4. The barrier film according to claim 1, wherein a plasma treatment process is applied to the uppermost surface of the barrier layer.

TABLE 6

| | HMDSO: TMOS (mole ratio) | Water repellent layer Si:O:C (Atomic percent) | Measurement position (distance from the central part from the film thickness center with the premise that the entire film thickness is defined to be 100) | Dense layer Si:O:C (Atomic percent) | Measurement position (distance from the outermost surface with the premise that the film thickness is defined to be 100) | Thickness of Barrier layer (nm) | Water vapor transmission rate (g/m²/day) Before 500 hr storage | After 500 hr storage | Oxygen transmission rate (cc/m²/day · atm) Before 500 hr storage | After 500 hr storage |
|---|---|---|---|---|---|---|---|---|---|---|
| Example 31 | 1:0.45 | 100:105:103 | 1 | 100:145:63 | 4 | 25 | 2.0 | 2.0 | 1.8 | 1.8 |
| Example 32 | 1:0.30 | 100:104:132 | 2 | 100:132:85 | 6 | 23 | 1.7 | 1.8 | 2.5 | 2.6 |
| Example 33 | 1:0.75 | 100:108:85 | 1 | 100:158:53 | 5 | 27 | 2.1 | 2.1 | 2.0 | 2.0 |
| Comparative example 23 | 1:0.25 | 100:101:133 | 1 | 100:115:105 | 5 | 22 | 1.5 | 2.1 | 3.3 | 3.8 |
| Comparative example 24 | 1:0.80 | 100:123:77 | 2 | 100:168:54 | 6 | 28 | 3.0 | 4.5 | 2.0 | 2.5 |

As shown in the Table 6, the barrier films of the examples 31 to 33 have the oxygen transmission rate of 2.5 cc/m²/day·atm or less, and the water vapor transmission rate of 2.5 g/m²/day or less, and it was clear that a high barrier property is provided. In contrast, the barrier films of the comparative examples 23, 24 are insufficient in terms of the oxygen transmission rate and the water vapor transmission rate compared with the examples 31 to 33. Moreover, the oxygen transmission rate and the water vapor transmission rate after the storage for 500 hours in the environment testing device were deteriorated and they were insufficient compared with the examples 31 to 33.

5. The barrier film according to claim 1, wherein the barrier layer is deposited on the base material film via a resin layer.

6. The barrier film according to claim 1, wherein a resin layer is deposited on the barrier layer.

7. The barrier film according to claim 1, wherein the oxygen transmission rate (OTR) is 3 cc/m²/day atm or less, and the water vapor transmission rate (WVTR) is 3 g/m²/day or less.

8. A laminated material comprising a heat sealable resin layer deposited on at least one side surface of the barrier film according to claim 1.

9. A packaging container using the laminated material according to claim 8, produced by thermally fusing the heat sealable resin layer into a bag or a box.

10. An image display medium using the barrier film according to claim 1.

11. A barrier film comprising a base material film and a barrier layer deposited on at least one side surface of the base material film,
- wherein the barrier layer comprises a water repellent layer and a dense layer,
- the water repellent layer is a silicon oxide carbide film having the atomic percent of Si:O:C in a range of 100:40 to 120:80 to 160, and the thickness in a range of 2 to 300 nm,
- the dense layer is a silicon oxide carbide film having the atomic percent of Si:O:C in a range of 100:100 to 200:5 to 100, and the thickness in a range of 5 to 300 nm,
- the base material film is a resin film having the thickness in a range of 5 μm to 500 μm, and
- the barrier layer has a laminated structure comprising the water repellent layer sandwiched between two dense layers.

12. The barrier film according to claim 11, wherein the barrier layer is a silicon oxide carbide film with the atomic percent of O (oxygen) with respect to Si (silicon) increased continuously from the central part toward the both outer sides in the thickness direction and the atomic percent of C (carbon) with respect to Si (silicon) reduced from the central part toward the both outer sides.

13. The barrier film according to claim 11, wherein the barrier layer is laminated by two or more layers.

14. The barrier film according to claim 11, wherein a plasma treatment process is applied to the uppermost surface of the barrier layer.

15. The barrier film according to claim 11, wherein the barrier layer is deposited on the base material film via a resin layer.

16. The barrier film according to claim 11, wherein a resin layer is deposited on the barrier layer.

17. The barrier film according to claim 11, wherein the oxygen transmission rate (OTR) is 3 $cc/m^2$/day atm or less, and the water vapor transmission rate (WVTR) is 3 $g/m^2$/day or less.

18. A laminated material comprising a heat sealable resin layer deposited on at least one side surface of the barrier film according to claim 11.

19. A packaging container using the laminated material according to claim 18, produced by thermally fusing the heat sealable resin layer into a bag or a box.

20. An image display medium using the barrier film according to claim 11.

* * * * *